US009061320B2

(12) United States Patent
Hajati et al.

(10) Patent No.: US 9,061,320 B2
(45) Date of Patent: Jun. 23, 2015

(54) ULTRA WIDE BANDWIDTH PIEZOELECTRIC TRANSDUCER ARRAYS

(71) Applicants: Arman Hajati, Santa Clara, CA (US); Mats Ottosson, Santa Clara, CA (US)

(72) Inventors: Arman Hajati, Santa Clara, CA (US); Mats Ottosson, Santa Clara, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 319 days.

(21) Appl. No.: 13/648,225

(22) Filed: Oct. 9, 2012

(65) Prior Publication Data

US 2013/0293065 A1 Nov. 7, 2013

Related U.S. Application Data

(60) Provisional application No. 61/641,182, filed on May 1, 2012.

(51) Int. Cl.
*H01L 41/09* (2006.01)
*B06B 1/06* (2006.01)

(52) U.S. Cl.
CPC .................................... *B06B 1/0629* (2013.01)

(58) Field of Classification Search
USPC .................... 310/334, 367, 369, 324; 367/92; 381/191
See application file for complete search history.

(56) References Cited

U.S. PATENT DOCUMENTS

| | | | | |
|---|---|---|---|---|
| 4,398,116 | A * | 8/1983 | Lewis | 310/334 |
| 5,115,810 | A * | 5/1992 | Watanabe et al. | 600/459 |
| 5,969,621 | A | 10/1999 | Getman et al. | |
| 6,262,946 | B1 | 7/2001 | Khuri-Yakub et al. | |

(Continued)

FOREIGN PATENT DOCUMENTS

| | | |
|---|---|---|
| EP | 1764162 | 3/2007 |
| EP | 2110186 | 10/2009 |

(Continued)

OTHER PUBLICATIONS

"Non Final Office Action for U.S. Appl. No. 13/835,500", (Sep. 26, 2013), Whole Document.

(Continued)

*Primary Examiner* — Thomas Bougherty
(74) *Attorney, Agent, or Firm* — Blakely, Sokoloff, Taylor & Zafman LLP

(57) ABSTRACT

Piezoelectric micromachined ultrasonic transducer (pMUT) arrays and systems comprising pMUT arrays are described. In an embodiment, coupling strength within a population of transducer elements provides degenerate mode shapes that split for wide bandwidth total response while less coupling strength between adjacent element populations provides adequately low crosstalk between the element populations. In an embodiment, differing membrane sizes within a population of transducer elements provides differing frequency response for wide bandwidth total response while layout of the differing membrane sizes between adjacent element populations provides adequately low crosstalk between the element populations. In an embodiment, close packing of membranes within a population of transducer elements provides improved efficiency for the wide bandwidth embodiments. In an embodiment, elliptical piezoelectric membranes provide multiple resonant modes for wide bandwidth total response and high efficiency while orthogonality of the semi-principal axes between adjacent element populations provides adequately low crosstalk between the element populations.

35 Claims, 19 Drawing Sheets

(56) References Cited

U.S. PATENT DOCUMENTS

| | | | | |
|---|---|---|---|---|
| 7,477,572 | B2 | 1/2009 | Caronti et al. | |
| 7,646,133 | B2 | 1/2010 | Degertekin | |
| 7,652,410 | B2 * | 1/2010 | Prus | 310/334 |
| 7,902,722 | B2 * | 3/2011 | Vilkomerson | 310/322 |
| 2003/0137224 | A1 | 7/2003 | Zloter et al. | |
| 2004/0174773 | A1 | 9/2004 | Thomenius et al. | |
| 2004/0190377 | A1 * | 9/2004 | Lewandowski et al. | 367/174 |
| 2005/0203397 | A1 | 9/2005 | Degertekin | |
| 2007/0059858 | A1 | 3/2007 | Caronti et al. | |
| 2007/0164631 | A1 | 7/2007 | Adachi et al. | |
| 2007/0193354 | A1 | 8/2007 | Felix et al. | |
| 2008/0013405 | A1 * | 1/2008 | Moon et al. | 367/92 |
| 2009/0161490 | A1 | 6/2009 | Wall et al. | |
| 2009/0163129 | A1 * | 6/2009 | Durjan et al. | 452/103 |
| 2009/0182237 | A1 * | 7/2009 | Angelsen et al. | 600/459 |
| 2009/0204001 | A1 | 8/2009 | Ona et al. | |
| 2009/0301200 | A1 | 12/2009 | Tanaka et al. | |
| 2010/0168583 | A1 * | 7/2010 | Dausch et al. | 600/466 |
| 2010/0174195 | A1 * | 7/2010 | Haider et al. | 600/459 |
| 2010/0268058 | A1 | 10/2010 | Chen | |
| 2010/0277040 | A1 | 11/2010 | Klee et al. | |
| 2010/0327695 | A1 * | 12/2010 | Goel et al. | 310/320 |
| 2011/0074248 | A1 | 3/2011 | Hishinuma | |
| 2012/0176002 | A1 | 7/2012 | Kim et al. | |

FOREIGN PATENT DOCUMENTS

| | | |
|---|---|---|
| EP | 2130495 | 12/2009 |
| JP | 2009260723 | 11/2009 |
| WO | WO-0225630 | 3/2002 |
| WO | WO-2004016036 | 2/2004 |
| WO | WO-2007013814 | 1/2007 |
| WO | WO-2011094393 | 8/2011 |

OTHER PUBLICATIONS

PCT, International Search Report and Written Opinion of the International Searching Dec. 13, 2013.

Authority for International Application No. PCT/US2013/037379, (Dec. 13, 2013), Whole Document.

"PCT, International Search report and Written Opinion of the International Searching Authority for International Application No. PCT/US13/63255", (Feb. 7, 2014), Whole Document.

"PCT, International Search Report and Written Opinion of the International Searching Authority for International Application No. PCT/US2013/037382", (Feb. 4, 2014), Whole Document.

"PCT, International Search Report and Written Opinion of the International Searching Authority for International Application No. PCT/US2013/037419", (Mar. 28, 2014), Whole Document.

"PCT, Preliminary Report on Patentability (Chapter I of the Patent Cooperation Treaty) for International Application No. PCT/US2013/037379", (Nov. 13, 2014), Whole Document.

"PCT, Preliminary Report on Patentability (Chapter I of the Patent Cooperation Treaty) for International Application No. PCT/US2013/037419", (Nov. 13, 2014), Whole Document.

"PCT, Preliminary Report on Patentability (Chapter I of the Patent Cooperation Treaty) for International Application No. PCT/US2013/037382", (Nov. 13, 2014), Whole Document.

* cited by examiner

ULTRA WIDE BANDWIDTH PIEZOELECTRIC TRANSDUCER ARRAYS

CROSS-REFERENCE TO RELATED APPLICATIONS

This application claims the benefit of U.S. Provisional Application No. 61/641,182 filed on May 1, 2012 titled "ULTRA WIDE BANDWIDTH PIEZOELECTRIC TRANSDUCER ARRAYS," the content of which is hereby incorporated by reference in its entirety for all purposes.

TECHNICAL FIELD

Embodiments of the invention generally relate to piezoelectric transducers, and more specifically pertain to piezoelectric micromachined ultrasonic transducer (pMUT) arrays.

BACKGROUND

An ultrasonic piezoelectric transducer device typically includes a piezoelectric membrane capable of vibrating in response to a time-varying driving voltage to generate a high frequency pressure wave in a propagation medium (e.g., air, water, or body tissue) in contact with an exposed outer surface of the transducer element. This high frequency pressure wave can propagate into other media. The same piezoelectric membrane can also receive reflected pressure waves from the propagation media and convert the received pressure waves into electrical signals. The electrical signals can be processed in conjunction with the driving voltage signals to obtain information on variations of density or elastic modulus in the propagation media.

While many ultrasonic transducer devices that use piezoelectric membranes are formed by mechanically dicing a bulk piezoelectric material or by injection molding a carrier material infused with piezoelectric ceramic crystals, devices can be advantageously fabricated inexpensively to exceedingly high dimensional tolerances using various micromachining techniques (e.g., material deposition, lithographic patterning, feature formation by etching, etc.). As such, large arrays of transducer elements are employed with individual ones of the arrays driven via beam forming algorithms. Such arrayed devices are known as pMUT arrays.

One issue with conventional pMUT arrays is that the bandwidth, being a function of the real acoustic pressure exerted from the transmission medium, may be limited. Because ultrasonic transducer applications, such as fetal heart monitoring and arterial monitoring, span a wide range of frequencies (e.g., lower frequencies providing relatively deeper imaging capability and higher frequencies providing shallower imaging capability), axial resolution (i.e. the resolution in the direction parallel to the ultrasound beam) would be advantageously improved by shortening the pulse length via enhancing the bandwidth of a pMUT array for a given frequency.

Another issue with conventional pMUT arrays is that the mechanical coupling through the vibration of the substrate and the acoustic coupling between close elements found in a pMUT array can lead to undesirable crosstalk between transducer elements. Signal to noise ratios in the ultrasonic transducer applications would be advantageously improved by reducing undesirable forms of crosstalk within such pMUT arrays.

SUMMARY

Wide bandwidth piezoelectric micromachined ultrasonic transducer (pMUT) arrays and systems comprising wide bandwidth pMUT arrays are described herein. In an embodiment, a piezoelectric micromachined ultrasonic transducer (pMUT) array includes a plurality of independently addressable drive/sense electrode rails disposed over an area of a substrate and a plurality of piezoelectric transducer element populations. Each drive/sense electrode within an element population is coupled to one of the drive/sense electrode rails. Within the array, electromechanical coupling between transducer elements of different transducer element populations is less than electromechanical coupling between transducer elements of a same element population, and each transducer element population is to provide a plurality of separate but overlapping frequency responses for cumulative wide bandwidth operation.

In an embodiment, electromechanical coupling between transducer elements of a same element population is sufficient to induce one or more degenerate modes, at least one degenerate mode having a degenerate resonant frequency split from a natural resonant frequency of an individual piezoelectric transducer element in the element population to increase bandwidth of the element population.

In an embodiment, each piezoelectric transducer element population of a pMUT array comprises a plurality of piezoelectric membranes of differing nominal membrane size to provide a plurality of separate resonant frequencies spanning a wide bandwidth. In embodiments, the element population has transducer elements of a same size spaced apart by at least one intervening element of a different size to reduce crosstalk by having nearest neighboring elements at different resonant frequencies (i.e., off-resonance) with respect to each other.

In an embodiment, element populations coupled to a same drive/sense electrode rail (i.e., of a same channel) have transducer elements arranged with nearest neighbors of a given transducer element being of a closely matching, but different, membrane size, for a graduated spatial variation of membrane size and better resonant phase control. In an embodiment, piezoelectric membranes of each piezoelectric transducer element population have an asymmetrical element layout to reduce the number of nearest neighbors of differing size within an element population for reduce transmission media dampening.

In an embodiment, piezoelectric membranes of each piezoelectric transducer element population are in a close packed configuration to increase sensitivity of a pMUT array. In an embodiment, separate element populations are not closely packed with each other to provide greater spacing than the close packed spacing within a population to reduce crosstalk between populations.

In an embodiment, at least one piezoelectric transducer element in each of the element populations comprises a piezoelectric membrane having a non-circular geometry with at least first and second semi-principal axes of differing nominal length to provide a plurality of separate resonant frequencies for wide bandwidth response. In an embodiment, the first and second semi-principal axes for elliptical membranes within one of the piezoelectric transducer element populations are parallel. In an embodiment, first and second semi-principal axes of a first element population have a first orientation while first and second semi-principal axes of a second element population adjacent to the first population have a second orientation, orthogonal to the first orientation.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specifically denoted as being mutually exclusive.

The term "coupled" is used herein to describe functional or structural relationships between components. "Coupled" may be used to indicated that two or more elements are in either direct or indirect (with other intervening elements between them or through the medium) mechanical, acoustic, optical, or electrical contact with each other, and/or that the two or more elements co-operate or interact with each other (e.g., as in a cause and effect relationship).

The terms "over," "under," "between," and "on" as used herein refer to a relative position of one component or material layer with respect to other components or layers where such physical relationships are noteworthy for mechanical components in the context of an assembly, or in the context of material layers of a micromachined stack. One layer (component) disposed over or under another layer (component) may be directly in contact with the other layer (component) or may have one or more intervening layers (components). Moreover, one layer (component) disposed between two layers (components) may be directly in contact with the two layers (components) or may have one or more intervening layers (components). In contrast, a first layer (component) "on" a second layer (component) is in direct contact with that second layer (component).

It is to be understood that while the various embodiments described herein are all presented in the context of a pMUT, one or more of the structures or techniques disclosed may be applied to other types of ultrasonic transducer arrays and indeed even more generally to various other MEMs transducer arrays, for example those in inkjet technology. Thus, while a pMUT array is presented as a model embodiment for which certain synergies and attributes can be most clearly described, the disclosure herein has a far broader application.

Figure 1:
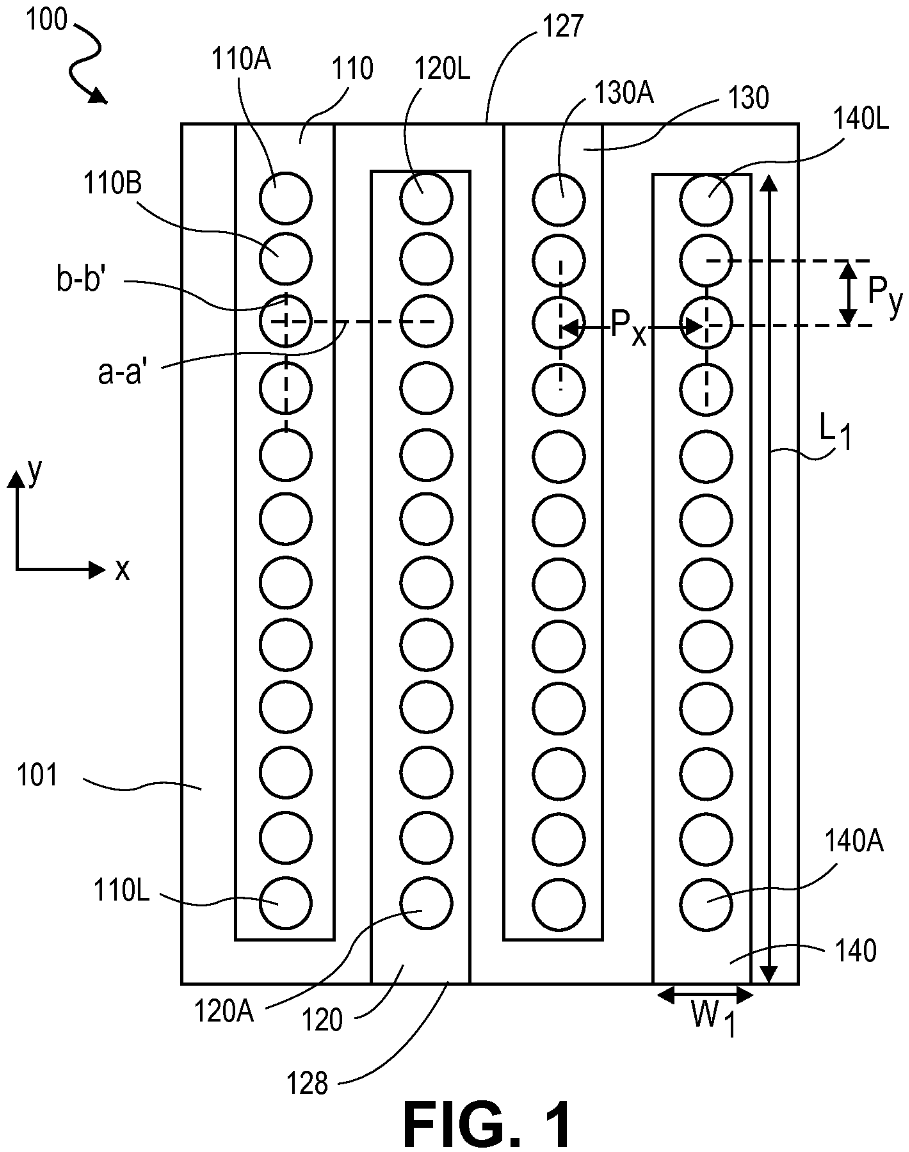
FIG. 1 is a plan view of a pMUT array with transducer elements, in accordance with an embodiment.
Figure 2A:
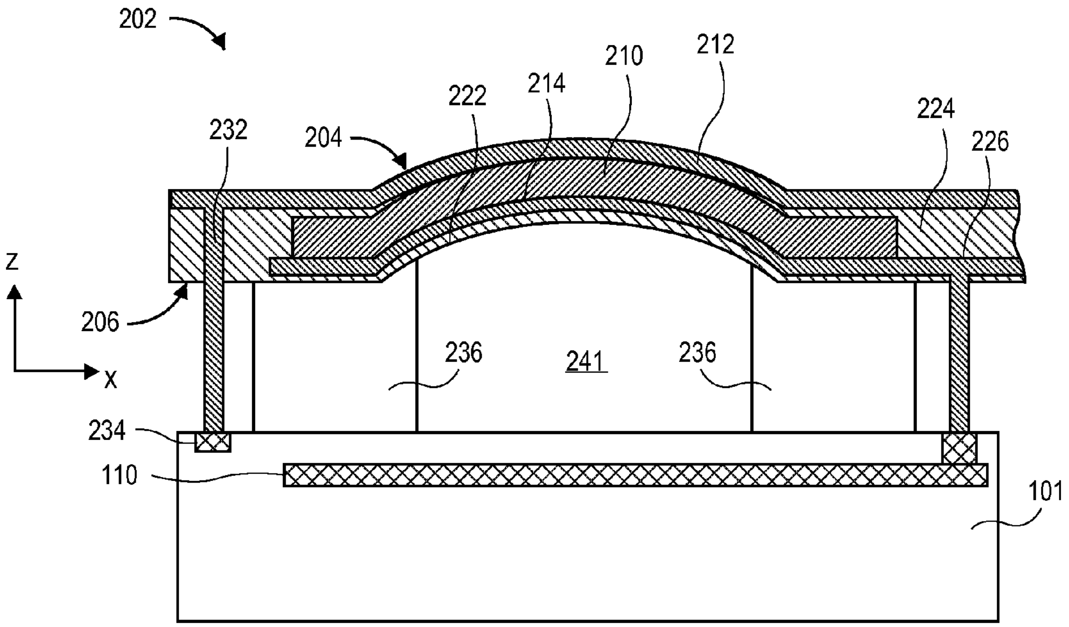
FIGS. 2A, 2B, and 2C are cross-sectional views of a transducer element which is utilized in the pMUT arrays of FIG. 1, in accordance with embodiments.
Figure 2B:
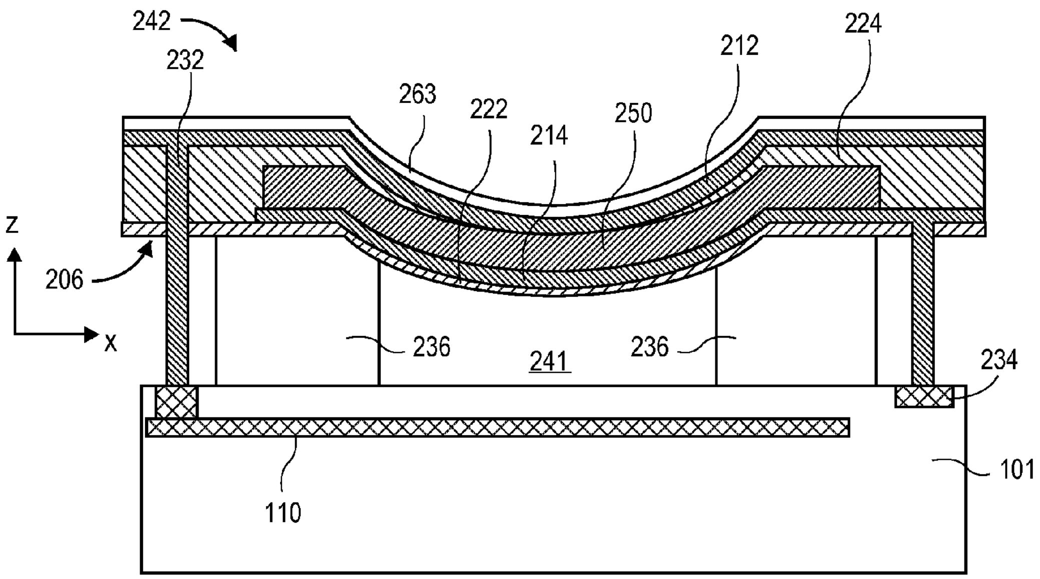
Figure 2C:
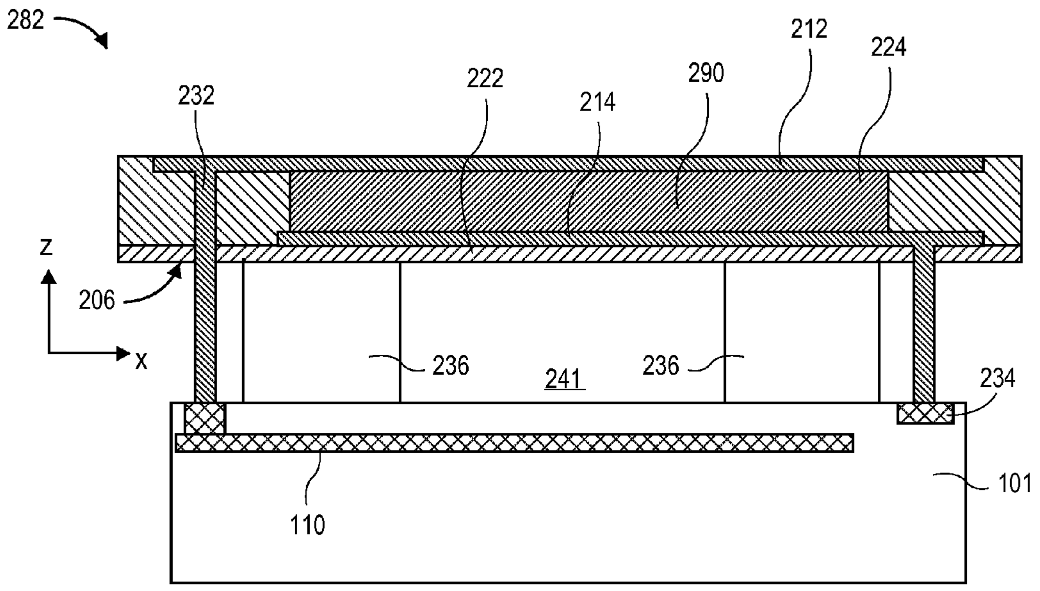

FIG. 1 is a plan view of a pMUT array 100, in accordance with an embodiment. FIGS. 2A, 2B, and 2C are cross-sectional views of transducer element embodiments, any of which may be utilized in the pMUT array 100, in accordance with embodiments.

The array 100 includes a plurality of electrode rails 110, 120, 130, 140 disposed over an area defined by a first dimension, x and a second dimension y, of a substrate 101. Each of the drive/sense electrode rails (e.g., 110) is electrically addressable independently from any other drive/sense electrode rails (e.g., 120 or 130). Both the drive/sense electrode rail and reference (e.g., ground) electrode rail are depicted in the cross-sectional views of FIG. 2A-2C. In FIG. 1, the drive/sense electrode rail 110 and drive/sense electrode rail 120 represent a repeating cell in the array. For example, with the first drive/sense electrode rail 110 coupled to a first bus 127 and the adjacent drive/sense electrode rail 120 coupled a second bus 128 to form an interdigitated finger structure. The drive/sense electrode rail 130 and drive/sense electrode rail 140 repeat the interdigitated structure with additional cells forming a 1D electrode array of arbitrary size (e.g., 128 rails, 256 rails, etc.).

In an embodiment, a pMUT array includes a plurality of piezoelectric transducer element populations. Each piezoelectric transducer element population operates as a lumped element with a frequency response that is a composite of the individual transducer elements within each element population. In an embodiment, within a given element population transducer elements drive/sense electrodes are electrically coupled in parallel to one drive/sense electrode rail so that all element drive/sense electrodes are at a same electrical potential. For example in FIG. 1, transducer elements 110A, 110B . . . 110L have drive/sense electrodes coupled to the drive/sense electrode rail 110. Similarly, transducer elements 120A-120L are all coupled in parallel to the drive/sense electrode rail 120. Generally, any number of piezoelectric transducer elements may lumped together, as a function of the array size in the second (y) dimension, and element pitch. In the embodiment depicted in FIG. 1, each piezoelectric transducer element population (e.g., 110A-110L) is disposed over a length $L_1$ of the substrate that is at least five times, and preferably at least an order of magnitude, larger than a width $W_1$ of the substrate.

In embodiments, each piezoelectric transducer element includes a piezoelectric membrane. While the piezoelectric membrane may generally be of any shape conventional in the art, in exemplary embodiments the piezoelectric membrane has rotational symmetry. For example, in the pMUT array 100, each transducer element includes a piezoelectric membrane having a circular geometry. The piezoelectric membrane may further be a spheroid with curvature in a third (z) dimension to form a dome (as further illustrated by FIG. 2A), or a dimple (as further illustrated in FIG. 2B). Planar membranes are also possible, as further illustrated in FIG. 2C.

In the context of FIGS. 2A-2C, exemplary micromachined (i.e., microelectromechanical) aspects of individual transducer elements are now briefly described. It is to be appreciated that the structures depicted in FIGS. 2A-2C are included primarily as context for particular aspects of the present invention and to further illustrate the broad applicability of the present invention with respect to piezoelectric transducer element structure.

In FIG. 2A, a convex transducer element 202 includes a top surface 204 that during operation forms a portion of a vibrating outer surface of the pMUT array 100. The transducer element 202 also includes a bottom surface 206 that is attached to a top surface of the substrate 101. The transducer element 202 includes a convex or dome-shaped piezoelectric membrane 210 disposed between a reference electrode 212 and a drive/sense electrode 214. In one embodiment, the piezoelectric membrane 210 can be formed by depositing (e.g., sputtering) piezoelectric material particles in a uniform layer on a profile-transferring substrate (e.g., photoresist) that has a dome formed on a planar top surface, for example. An exemplary piezoelectric material is Lead Zirconate Titanate (PZT), although any known in the art to be amenable to conventional micromachine processing may also be utilized, such as, but not limited to polyvinylidene difluoride (PVDF) polymer particles, BaTiO3, single crystal PMN-PT, and aluminum nitride (AlN). The drive/sense electrode and reference electrode 214, 212 can each be a thin film layer of conductive material deposited (e.g., by PVD, ALD, CVD, etc.) on the profile-profile transferring substrate. The conductive materials for the drive electrode layer can be any known in the art for such function, such as, but not limited to, one or more of Au, Pt, Ni, Ir, etc.), alloys thereof (e.g., AdSn, IrTiW, AdTiW, AuNi, etc.), oxides thereof (e.g., $IrO_2$, $NiO_2$, $PtO_2$, etc.), or composite stacks of two or more such materials.

Further as shown in FIG. 2A, in some implementations, the transducer element 202 can optionally include a thin film layer 222, such as silicon dioxide that can serve as a support and/or etch stop during fabrication. A dielectric membrane 224 may further serve to insulate the drive/sense electrode 214 from the reference electrode 212. Vertically-oriented electrical interconnect 226 connects the drive/sense electrode 214 to drive/sense circuits via the drive/sense electrode rail 110. A similar interconnect 232 connects the reference electrode 212 to a reference rail 234. An annular support 236, having a hole 241 with an axis of symmetry defining a center of the transducer element 202, mechanically couples the piezoelectric membrane 210 to the substrate 101. The support 236 may be of any conventional material, such as, but not limited to, silicon dioxide, polycrystalline silicon, polycrystalline germanium, SiGe, and the like. Exemplary thicknesses of support 236 range from 10-50 μm and exemplary thickness of the membrane 224 range from 2-20 μm.

FIG. 2B shows another example configuration for a transducer element 242 in which structures functionally similar to those in transducer element 202 are identified with like reference numbers. The transducer element 242 illustrates a concave piezoelectric membrane 250 that is concave in a resting state. Here, the drive/sense electrode 214 is disposed below the bottom surface of the concave piezoelectric membrane 250, while the reference electrode 212 is disposed above the top surface. A top protective passivation layer 263 is also shown.

FIG. 2C shows another example configuration for a transducer element 282 in which structures functionally similar to those in transducer element 202 are identified with like reference numbers. The transducer element 282 illustrates a planar piezoelectric membrane 290 that is planar in a resting state. Here, the drive/sense electrode 214 is disposed below the bottom surface of the planar piezoelectric membrane 290, while the reference electrode 212 is disposed above the top surface. An opposite electrode configuration from that depicted in each of FIGS. 2A-2C is also possible.

Figure 3A:
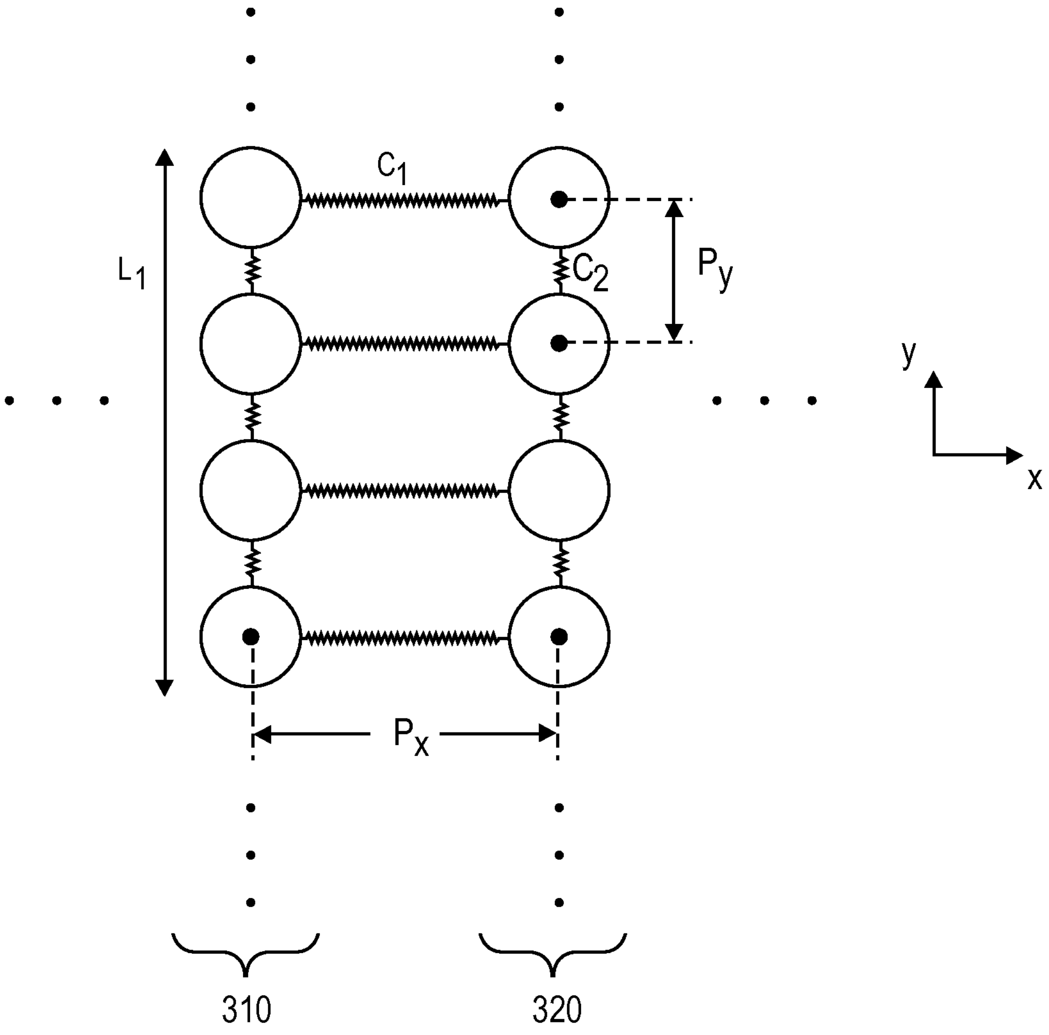
FIG. 3A is a schematic depicting relative electromechanical coupling between transducers within the pMUT array illustrated in FIG. 1, in accordance with an embodiment.

In an embodiment, within a pMUT array, electromechanical coupling between transducer elements of different transducer element populations is less than electromechanical coupling between transducer elements of a same element population. Such a relationship is to reduce crosstalk between adjacent populations (e.g., between lines in the exemplary 1D array). FIG. 3A is a diagrammatic representation of relative electromechanical coupling between transducers within the pMUT array 100 illustrated in FIG. 1, in accordance with an embodiment. As shown, between a first element population 310 and a second, adjacent or nearest neighboring element population 320, there is a first coupling factor $C_1$ that is relatively smaller (e.g., a long coupling spring) than a second coupling factor $C_2$ (e.g., a short coupling spring) between individual elements within a population (e.g., population 320). Referring again to FIG. 2A-2C, at least the substrate 101, and typically also the support 236 extend laterally in the x and y dimensions between adjacent transducer elements and thereby provide electromechanical isolation between adjacent transducer elements. As such, electromechanical coupling between transducer elements is generally dependent on the material(s) selected for the substrate 101 and support 236. Intrinsic material properties, such as the elastic modulus, affect electromechanical coupling between transducer elements as do extrinsic properties, such as dimensional attributes including the distance (in x-y plane) between adjacent transducers and an effective cross-sectional coupling area that may include the film thickness of the support 236 (z-heights) and feature width of the support (in x-y plane), and like characteristics for the substrate 101.

Figure 3B:
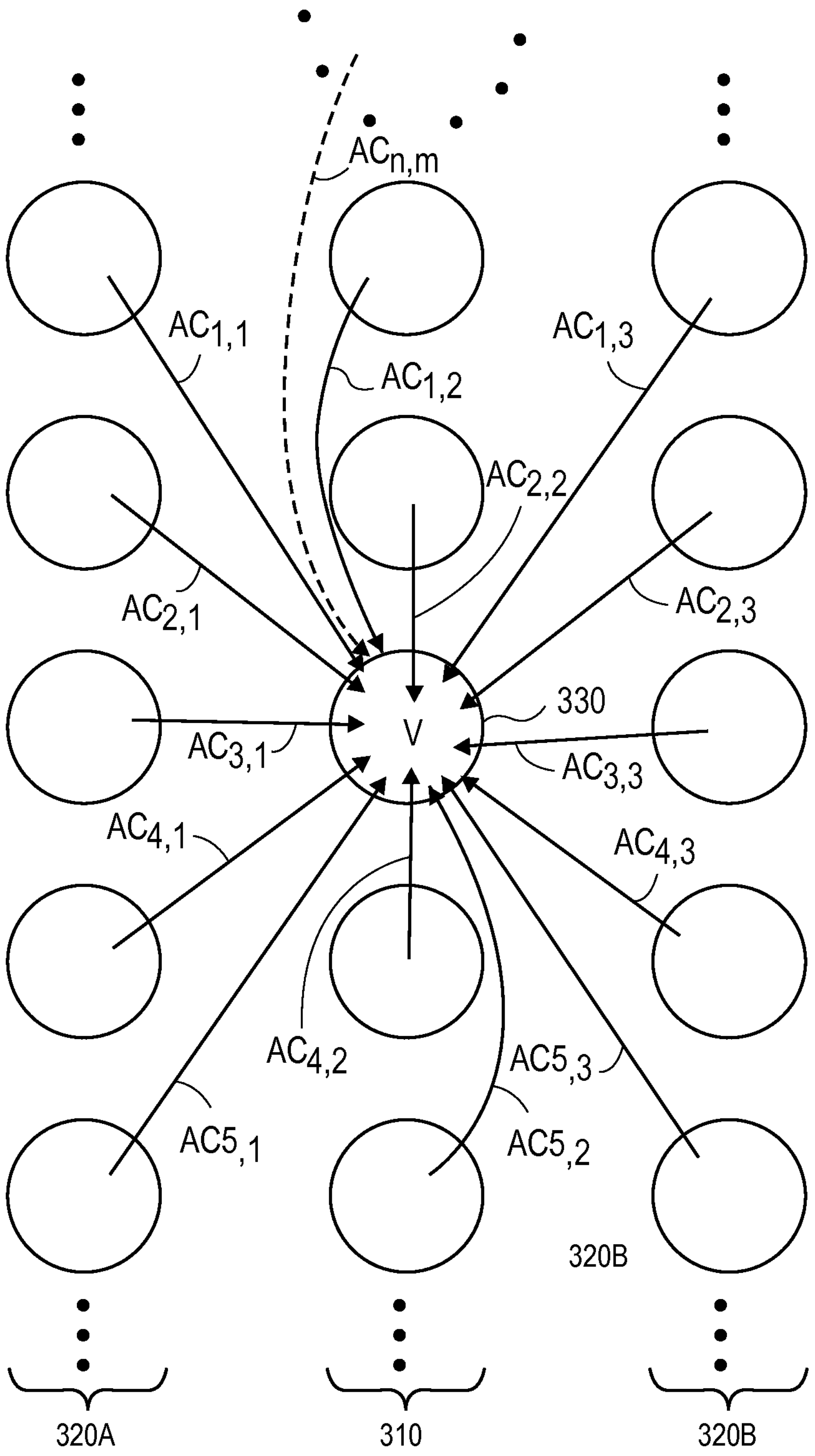
FIG. 3B is a schematic depicting acoustic coupling between transducers within the pMUT array illustrated in FIG. 1, in accordance with an embodiment.

FIG. 3B is a schematic depicting acoustic coupling between transducers within the pMUT array illustrated in FIG. 1, in accordance with an embodiment. As shown, coupling between transducers through the transmission media itself (i.e., "acoustic coupling") remains significant over greater distances than does the electromechanical coupling effects illustrated in FIG. 3A. For example, not only do nearest neighboring transducers pose a source of cross-talk, but so to do transducers disposed a distance of two or more transducer widths away from a victim transducer. In FIG. 3B, for a given victim transducer 330, acoustic coupling terms "AC" from a great number of offender transducers (e.g., $AC_{1,1}$; $AC_{1,2}$, $AC_{1,3}$, $AC_{2,1}$, $AC_{2,2}$, $AC_{2,3}$, . . . $AC_{n,m}$ for the rows/columns of transducer population 310, 320A, and 320B) may be significant depending on at least the properties of the media, operative frequency range and phase of each transducer as a function of the spatial arrangement of transducers. It is currently understood that coupling between a first "victim" membrane (e.g., 330) and neighboring membranes (e.g., adjacent membranes as well as non-adjacent membranes disposed two or more membrane diameters from the first membrane) through the transmission media itself (e.g., water) can adversely modulate the effective mass of the membranes where proximal elements have membranes of diameters that vary too greatly.

In an embodiment where a wide bandwidth is to be provided by the pMUT array 100, each transducer element population is to provide a plurality of separate but overlapping frequency responses. In one such embodiment, the electromechanical coupling (or acoustic coupling) between transducer elements of a similar resonance frequency within one population results in at least one degenerate mode shape having a degenerate resonant frequency split from a natural resonant frequency of an individual piezoelectric transducer element in the element population. Degenerate resonant modes can be modeled as a plurality of substantially equal masses coupled to a first springs having similar a first spring constants and further coupled to each other by springs of having similar second spring constants. Where coupling between transducer elements of a same element population is sufficient to induce a plurality of degenerate modes, degenerate modes of the plurality having a degenerate resonant frequency are split from each other to similarly provide a wider bandwidth response than the natural resonance frequency of the individual transducer elements.

Figure 4A:
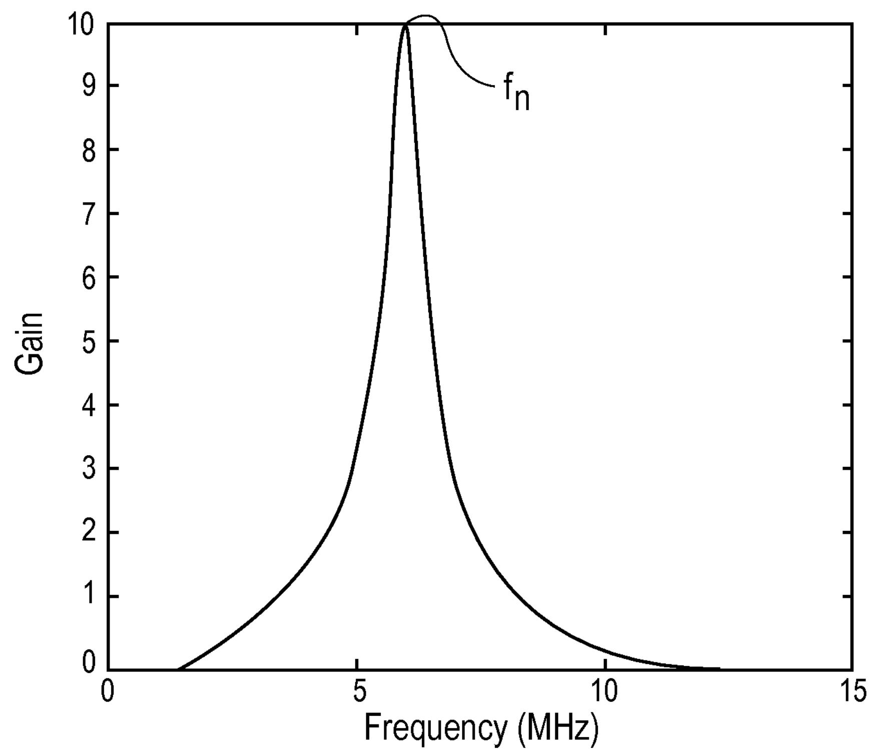
FIGS. 4A and 4B are graphs of transducer performance metrics for first amount of coupling between transducer elements within the pMUT array illustrated in FIG. 1.
Figure 4B:
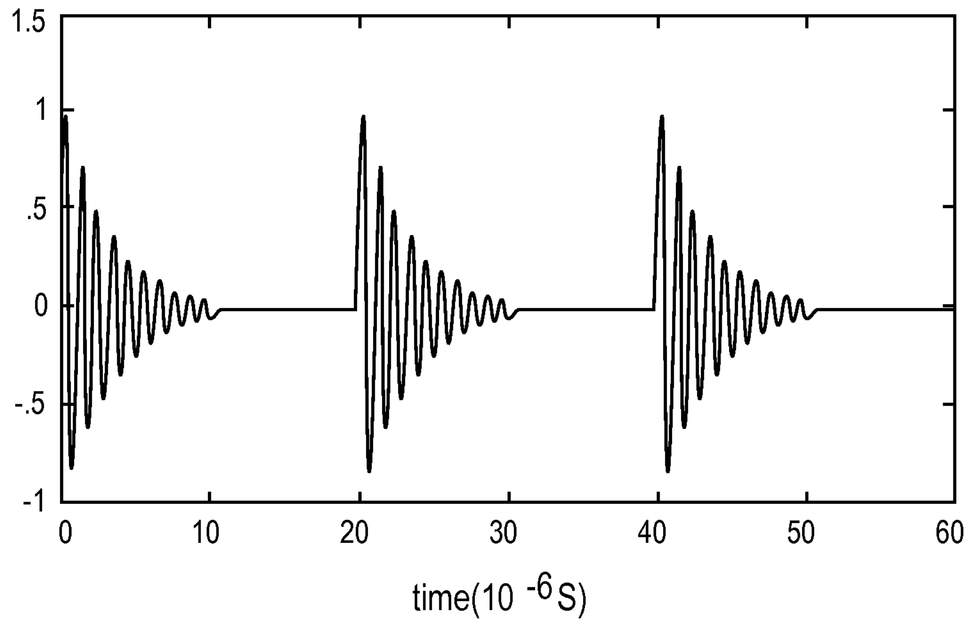

FIGS. 4A and 4B are graphs of transducer performance metrics for transducer elements within the pMUT array 100 of FIG. 1 assuming coupling between all transducer elements is arbitrarily small, and therefore represents the cumulative frequency response of a plurality of well-isolated individual transducer elements. As shown in FIG. 4A, a center frequency $F_n$ has a peak power gain around 5.5 MHz, corresponding to a natural frequency characteristic of a transducer element with a dome piezoelectric membrane having a nominal diameter of 75 μm. The corresponding spectral bandwidth for 3 dB corner frequencies is about 1 MHz.

Figure 5:
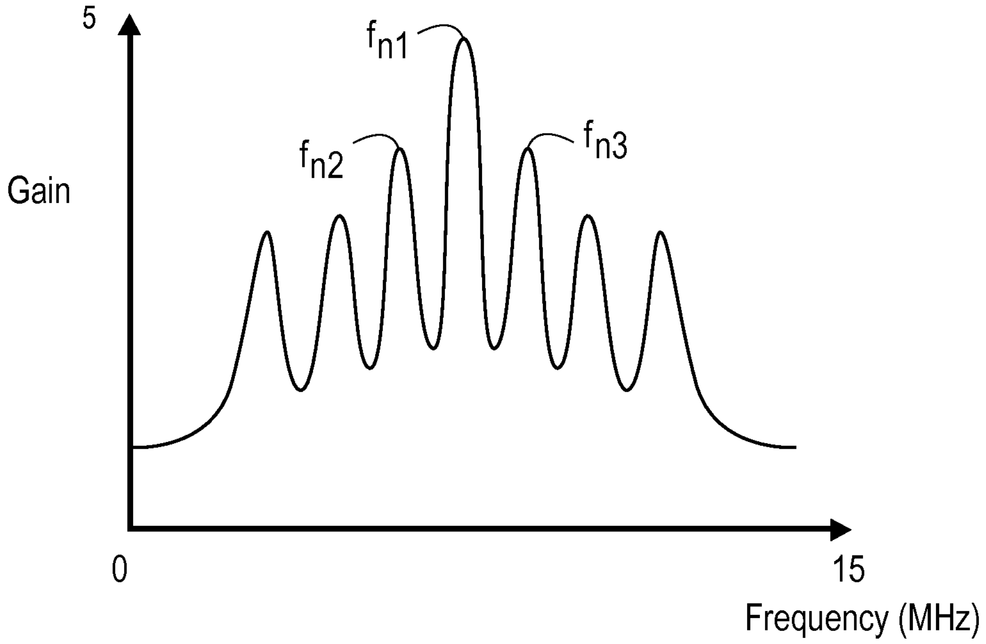
FIG. 5 is a graph of transducer performance metrics for a second amount of coupling between transducer elements within the pMUT array illustrated in FIG. 1, in accordance with an embodiment.

FIG. 5 is a graph of spectral power gain for a same transducer element population as that of FIG. 4A (e.g., same number of elements having the same natural resonance). However, the amount of coupling between transducer elements within an element population is sufficient to induce resonant mode splitting, in accordance with an embodiment. As shown, in addition to the fundamental resonance frequency $F_{n1}$, additional center frequencies $F_{n2}$, $F_{n3}$, etc., split from the fundamental resonance mode to provide a plurality of separate but overlapping frequency responses that span a wider spectral band than any of the individual spectral responses. While in the exemplary response graph illustrated in FIG. 5 includes seven overlapping frequency responses, the amount of splitting can be controlled (e.g., to have more than two distinct frequency peaks, or a bandwidth between 3 dB corners that is at least 1.5 times that of any one the modes, etc.) through proper array design.

In embodiments, at least one of a distance, the elastic modulus of an interconnecting material, or a cross-sectional coupling area of a first region between transducer elements of a same element population is different than a corresponding one of a second region between transducer elements of a different element populations. Referring again to FIG. 3, for one exemplary embodiment, piezoelectric membranes of a given size (e.g., a same diameter in the exemplary circular/spherical embodiment), the distance between the elements in the population 320 may be set by a pitch in the y-dimension ($P_y$) to achieve degenerate mode frequency response splitting via control of the spacing between adjacent ones of the element population 320 along the length $L_1$. For example, the $P_y$ for the exemplary embodiment having the response in FIG. 5 is reduced relative to that having the response illustrated in FIG. 4A. Noting again that electromechanical coupling is reduced and preferably minimized between transducer element populations (e.g., between population 310 and 320 in FIG. 3A) so that crosstalk between adjacent populations (lines in exemplary 1D arrays) is minimized, in further embodiments, the line pitch $P_x$ is significantly larger than is transducer pitch along the line dimension $P_y$ (e.g., twice as large, or more).

Figure 6A:
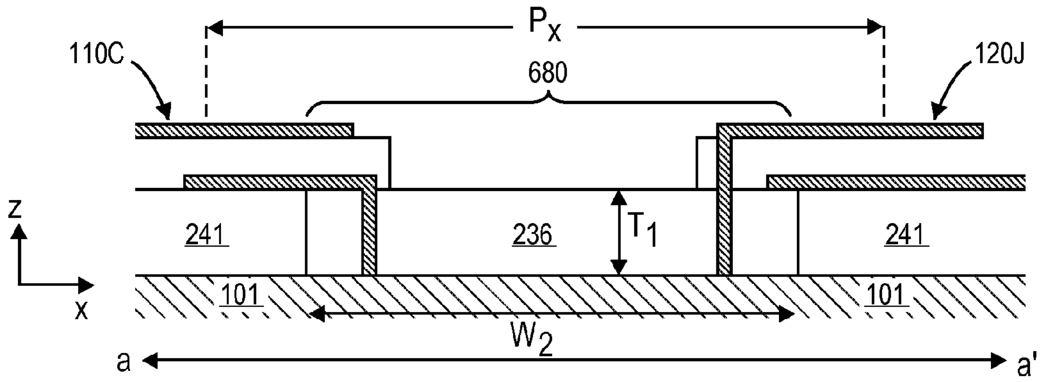
FIGS. 6A, 6B, and 6C are cross-sectional views of an inter-transducer regions of the pMUT arrays of FIG. 1, in accordance with embodiments.
Figure 6B:
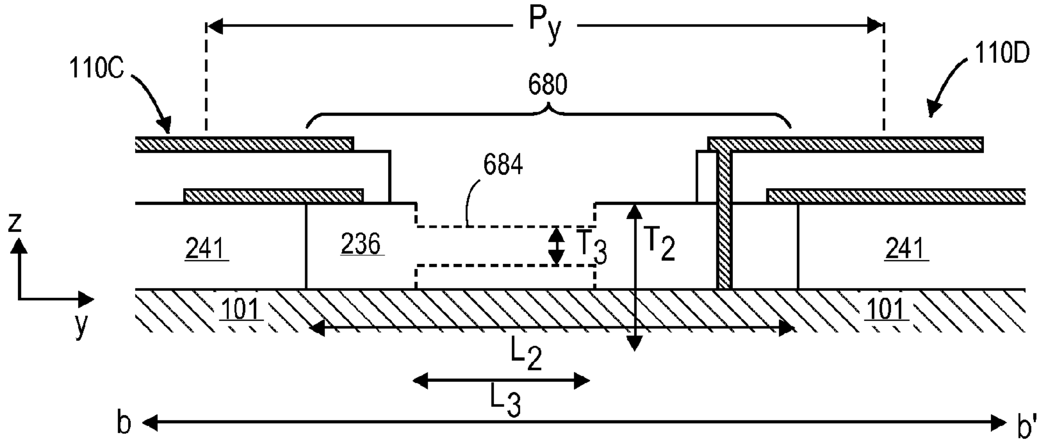
Figure 6C:
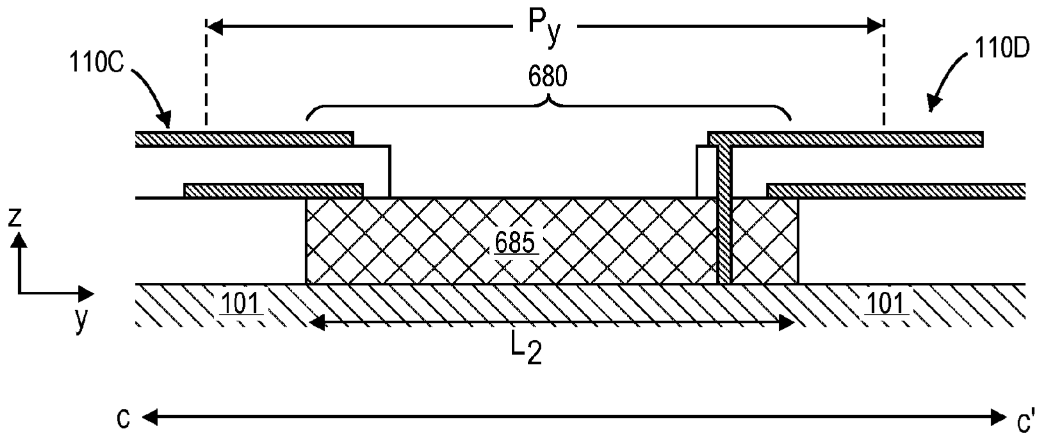

In addition to spacing or distance between transducer elements, one or more of material distinctions or patterning of mechanical couplings between transducer elements may be modulated to affect degenerate mode coupling within an element population while maintaining reduced or minimized crosstalk between element populations. FIGS. 6A, 6B, and 6C are cross-sectional views of inter-transducer regions of the pMUT array 100 in FIG. 1, in accordance with embodiments. FIG. 6A is a cross-sectional view along the a-a' line denoted in FIG. 1 that spans the pitch $P_x$ (i.e., the line pitch) between adjacent transducer elements 110C and 120J on separate electrode rails 110, 120. Along the a-a' line the region 680 spans a distance $W_2$ between adjacent transducer openings 241. Within the region 680 is one or more material, such as the support 236 and the substrate 101. FIGS. 6B and 6C are cross-sectional views cross-sectional views along the b-b' line denoted in FIG. 1 that spans the pitch $P_y$ between adjacent transducer elements 110C and 110C coupled to a same electrode rail 110, 120 (i.e., the line pitch). Along the b-b' line, the region 690 spans a distance $L_2$ between adjacent transducer openings 241.

In the embodiment illustrated in FIG. 6B, relative to corresponding dimensions of region 680, the region 690 is patterned to have greater electromechanical coupling. In one such embodiment, the support 236 is etched to reduce anchoring to the substrate 101 along the length $L_3$ so that displacement in one support structure 236 is transmitted across membrane bridge 684A having a thickness of $T_3$. In another embodiment, the substrate 101 is etched to reduce the thickness $T_2$ in the region 690. Any such modification of cross-sectional coupling area may be made selectively to either region 680 or 690 with a similar patterning further possible in the x-y plane. As such, the illustrated modification of the support 236 is merely an example and many forms other forms are possible as dependent on the process employed to fabricate the transducer elements.

In the embodiment illustrated in FIG. 6C, relative to corresponding materials of region 680, the region 690 has a different elastic modulus so as to have greater electromechanical coupling. As shown, a material 685 employed in the region 690 is distinct from that employed in the region 680. In this manner, elastic modulus of either some portion of the support structures 236, or some portion of the substrate 101, is distinguished to tune electromagnetic coupling for split degenerate modes within one element population and reduced or minimized crosstalk between populations.

Notably, one or more of the techniques described herein may be utilized for differentiating the amount of coupling between adjacent transducers of a same population from that between adjacent transducer of different populations. For example, in one embodiment, the distance between elements of a same element population is made sufficiently small to induce the at least one degenerate mode when the interconnecting material and cross-sectional coupling areas are the same in the regions 680 and 690. In another embodiment, two or more of the distance, the material properties, or the cross-sectional coupling area are different between the regions 680 and 690.

Figure 6D:
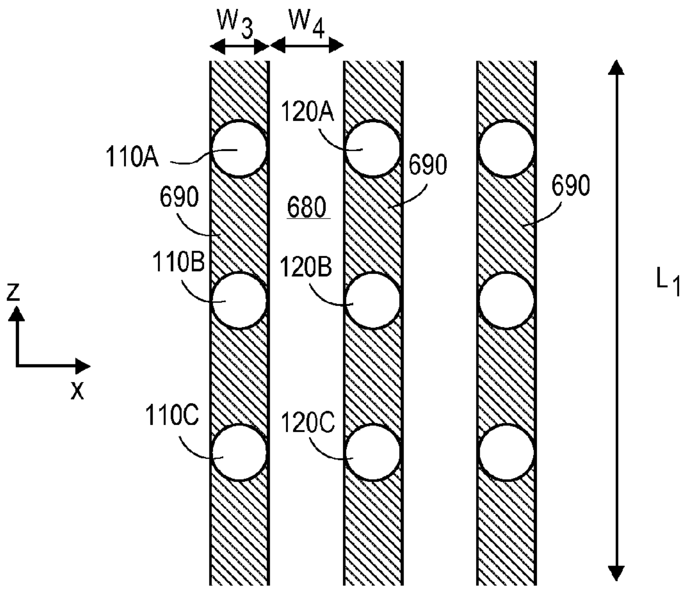
FIGS. 6D, 6E and 6F are plan views with the inter-transducer regions of FIGS. 6A-6C illustrated for the pMUT illustrated in FIG. 1, in accordance with embodiments.
Figure 6E:
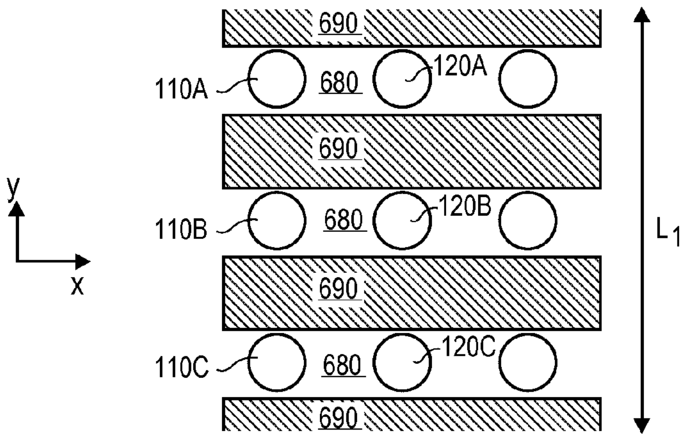
Figure 6F:
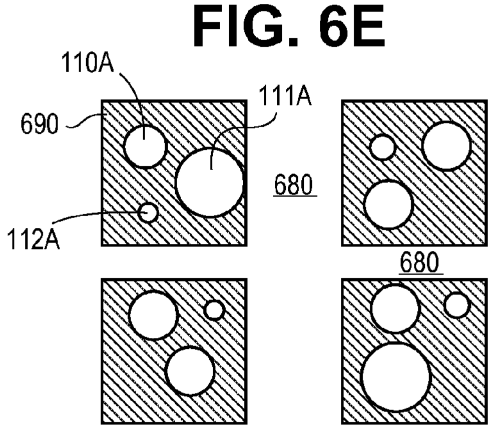

FIGS. 6D, 6E and 6F are plan views with the inter-transducer regions of FIGS. 6A-6C illustrated for the pMUT array 100, in accordance with embodiments. For the exemplary 1D array embodiment, FIG. 6D illustrates one embodiment where the region 690 (providing greater coupling) is disposed over a length of the substrate that extends parallel along the substrate length ($L_1$) occupied by the transducer element population (i.e. one line of transducer elements) and interconnects each element (110A, 110B, 110C, etc.) of one element population. The second region 680 (providing less coupling) is disposed on opposite sides of the first region 680 along the length of the region 690. In one illustrative embodiment, the region 680 forms a continuous stripe of, for example, a material distinct from that in region(s) 690, a feature (e.g., bridge coupler, etc.) distinct from that in region(s) 690 in which the elements 120A, 120B, 120C, etc. are disposed.

FIG. 6E illustrates another exemplary 1D embodiment where the region 690 is disposed over a length of the substrate that extends orthogonal to the substrate length $L_1$ occupied by the transducer element population, and being continuous between two adjacent elements of more than one element population. The region 680 is then again disposed on opposite sides of the region 690 along lengths of the region 690.

FIG. 6F illustrates an exemplary embodiment for 2D arrays where electrode rails are arrayed in both x and y dimensions, as described further elsewhere herein. In this embodiment, region 680 forms a continuous grid separating islands of region 690. Each region 690 serves to electromechanically couple transducer elements 110A, 111A, and 112A of a given population that is to be strongly coupled for degenerate mode splitting, but each population is isolated by the region 680.

Figure 6G:
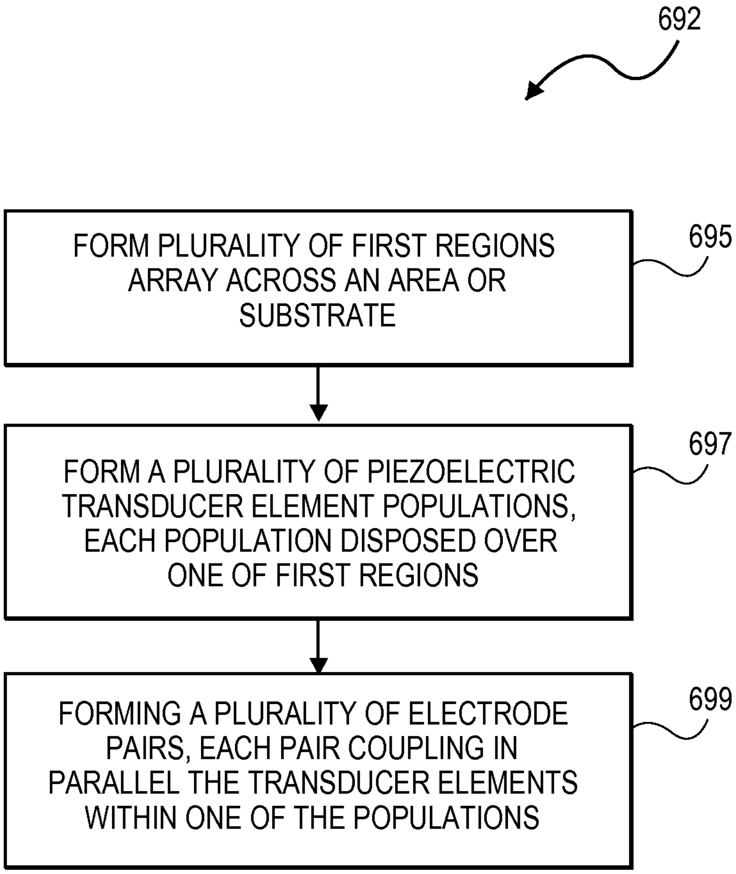
FIG. 6G is a flow diagram illustrating a method of forming a PMUT array, in accordance with embodiments.

FIG. 6G is a flow diagram illustrating a method 692 for forming a PMUT array, in accordance with embodiments. Generally, the 1D or 2D striping of the region 680 and/or 690 may be advantageous in the fabrication of transducer elements which are to be strongly coupled for degenerate mode splitting. For example, the method 692 beings at operation 695 where a plurality of a first of the regions 680 and 690 are arrayed over an area of a substrate with the second of the regions 680 and 690 disposed there between. In one exemplary embodiment, forming the first of regions 680 and 690 further comprises etching trenches into the substrate 101 or a film disposed thereon (e.g., support 236 shown in FIGS. 6A-6C). Alternatively, or in addition to etching such trenches, a thin film material layer may be deposited over the substrate 101 and subsequently removed from one of the regions 680 and 690 selectively to the other of the regions 680 and 690. Planarization may be performed as known in the art to arrive at a planar substrate surface of regions capable of distinct levels of coupling. At operation 697, a plurality of piezoelectric transducer element populations are formed, using any conventional technique(s), such that each population is disposed over one of the regions 690. At operation 699 a plurality of drive/sense electrode rails are coupled to have drive electrodes of one of the transducer element populations mechanically coupled by region(s) 690 and the region(s) 680 mechanically couple a first transducer element population to a second transducer element population.

In embodiments, a piezoelectric transducer element population includes a plurality of piezoelectric membranes of differing nominal size to provide a plurality of separate resonant frequencies. Spectral response may be shaped by integrating n different sizes (e.g., membrane diameters for the exemplary circular or spheriodal membranes described elsewhere herein) so as to provide for wide bandwidth. Unlike bulk PZT transducers, the resonance frequency of a pMUT can be readily tuned by geometry through lithography. As such, high-Q membranes of differing sizes may be integrated with different frequency responses to reach a high total bandwidth response from a given element population. In further embodiments, each transducer element population includes an identical set of transducer element sizes so that the spectral response from each population is approximately the same.

Figure 7A:
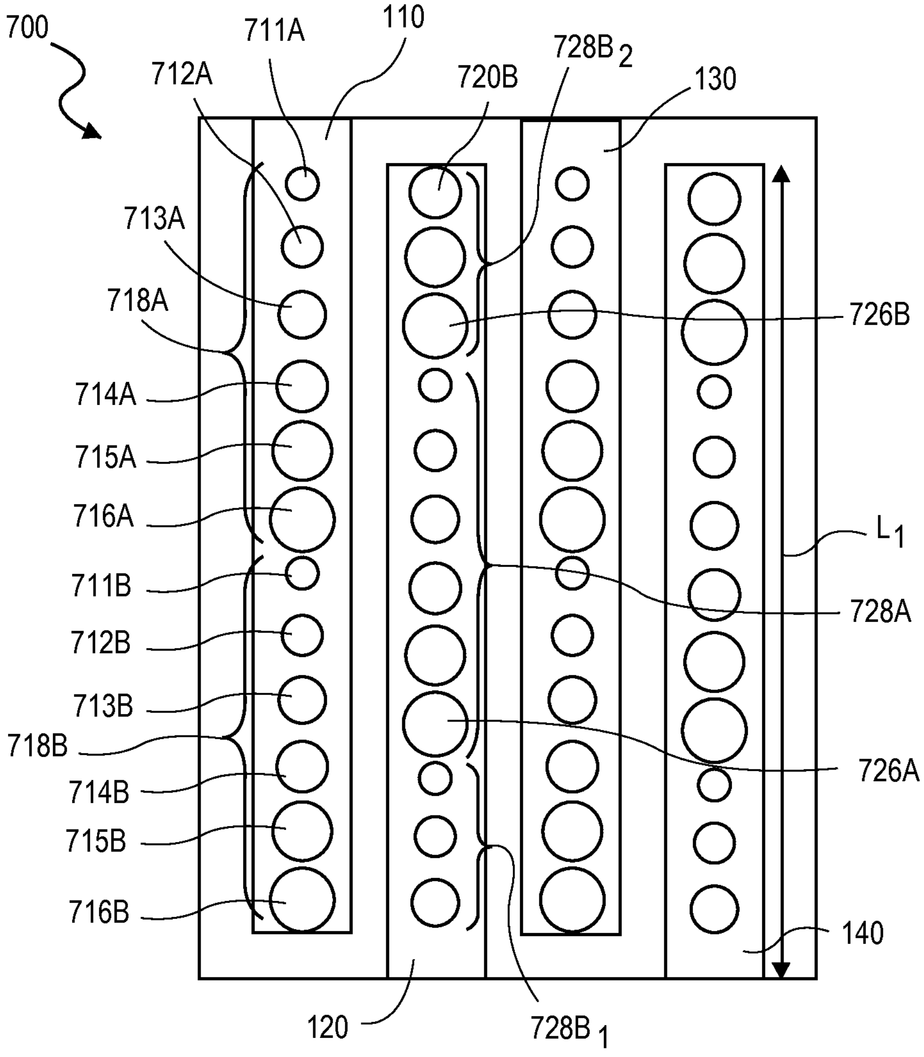
FIG. 7A is a plan view of a pMUT array with transducer elements of differing sizes, in accordance with an embodiment.

FIG. 7A is a plan view of a pMUT array 700 with transducer elements of differing sizes, in accordance with an embodiment. The pMUT array 700 has a similar layout as the pMUT array 100, with drive/sense electrode rails 110 and 120 being parallel, but extending in opposite directions (e.g., from separate buses or interfaces) so as to be interdigitated along the x-dimension (i.e., a 1D array). Electrically coupled to one drive/sense electrode (e.g., 110) are transducer elements having 2-20 different membrane sizes (e.g., diameters), or more. The range of diameters will generally depend on the desired frequency range as a function of membrane stiffness and mass. Increments between successively larger membranes may be a function of the range and number of differently sized membranes with less frequency overlap occurring for large size increments. An increment size can be selected to ensure all transducer elements contribute to response curve maintaining a 3 dB bandwith. As an example, the a range of 20-150 μm would be typical for MHz frequency responses from a transducer having the general structure described in the context of FIGS. 2A-2C and an increment of 1-10 μm would typically provide sufficient response overlap.

As the number of transducer element (i.e., membrane) sizes increases, the resolution at a particular center frequency can be expected to go down as the distance between elements of a same size decreases. For example, where piezoelectric membranes of each piezoelectric transducer element population are in single file (i.e., with centers aligned along a straight line), effective pitch of same-sized transducers along the length $L_1$ is reduced with each additional transducer size in the population. In further embodiments therefore, each piezoelectric transducer element population comprises more than one piezoelectric transducer element of each nominal membrane size. For the exemplary embodiment depicted in FIG. 7A, electrically coupled to drive/sense electrode rail 110 are piezoelectric transducer elements 711A and 711B of a first size (e.g., smallest diameter membrane), elements 712A, 712B of a second size (e.g., next to smallest diameter membrane), elements 713A, 713B, elements 714A, 714B, elements 715A, 715B, and elements 716A, 716B for six different sizes of membrane. As shown, membranes of the same size (e.g., 711A and 711B) are spaced apart by at least one intervening element having a membrane of different size. This has the advantage of reducing crosstalk because nearest neighboring elements which generally induces the most crosstalk will be off resonance with respect to each other. It is also advantageous to space out elements of a same size by a same amount such that resolution is comparable across the frequency response band.

As shown in FIG. 7A, a transducer element subgroup 718A is repeated as 718B along the length of the substrate over which the element population is disposed. Each transducer element subgroup 718A, 718B includes one piezoelectric transducer element of each nominal membrane size. In this exemplary embodiment, a heuristic layout is such that the element population coupled to the drive/sense rail 110 has transducer elements of a same size spaced apart by at least one intervening element of a different size, but are spaced apart by no more than a length of the substrate occupied by one element subgroup. This has the effect of improving the uniformity of signal. As further illustrated in FIG. 7A, the similar element subgroup 728A is shifted down the length of the drive sense electrode rail 120 relative to the element subgroup 718A so as to spread the various element sizes more uniformly. This positional offset also helps reduce crosstalk between the adjacent element populations by ensuring elements of a same size are not nearest neighbors (e.g., 726A is approximately half way between elements 716A and 716B). As shown, the positional offset of element subgroups comprising a repeating set of different size transducer elements is achieved by splitting at least one subgroup into two (e.g., $728B_1$ and $728B_2$) with a complete subgroup (e.g., 728A) alternating between the split subgroups within one rail or channel. The transducer element populations for rails 110 and 120 comprises a cell that is then repeated for rails 130 (e.g., with transducer 130A, etc.) and 140 (e.g., with transducers 140A-140L).

Figure 7B:
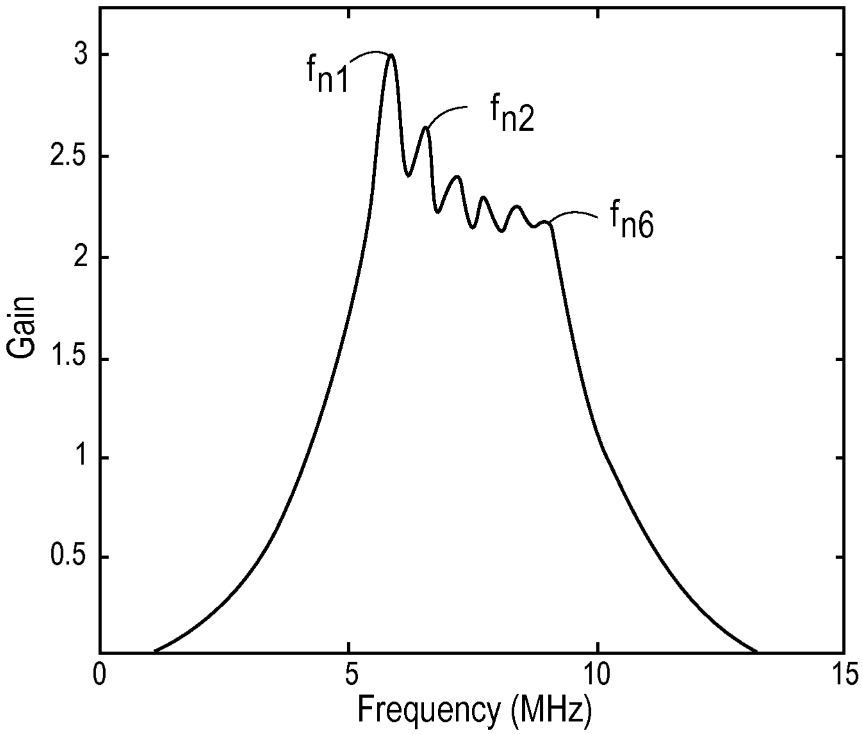
FIGS. 7B and 7C are plots of performance metrics for the PMUT array illustrated in FIG. 7A.
Figure 7C:
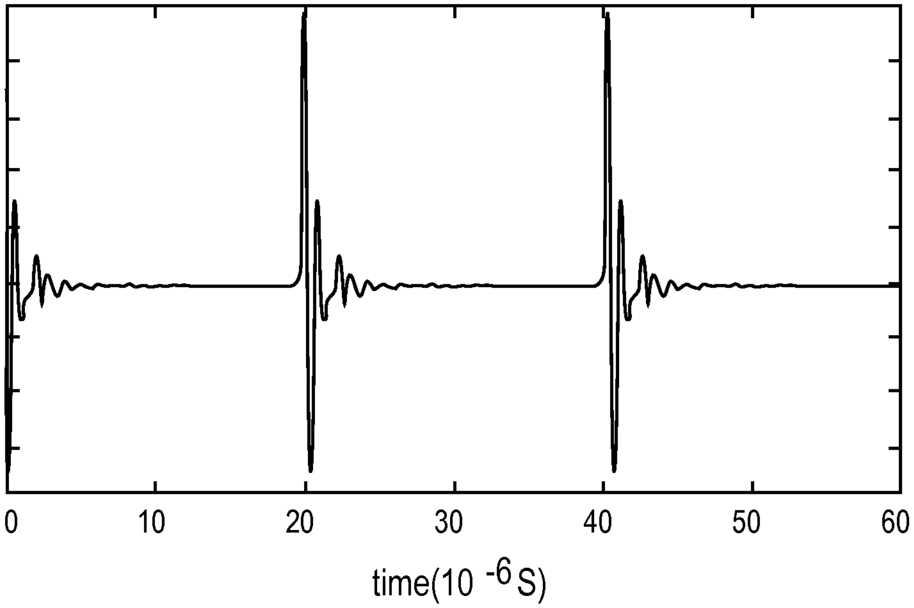

FIGS. 7B and 7C are plots of performance metrics for the PMUT array illustrated in FIG. 7A, having for example spheroidal piezoelectric membranes with diameters of 60, 63, 66, 69, 72 and 75 μm. As shown in FIG. 7B, the spectral response includes six corresponding center frequency peaks, $Fp_1$, $Fp_2$, . . . $Fp_6$ having a bandwidth (for 3 dB corner frequencies) of approximately 9 MHz. With $Fp_n$ peaks possible for n-sizes of transducer elements, the limitation in number of sizes is a function of how many transducers are available to be lumped together with an insufficient number resulting in insufficient gain. The wider bandwidth for the pMUT array 700 is apparent when compared with that illustrated in FIG. 4A (for the pMUT array 100 having elements of a single size and lacking degenerate modes). With the increase in bandwidth, a correspondingly short pulse duration with less ring down results in response to a pulse train excited as visible FIG. 7C for the pMUT array 700 relative to FIG. 4B for the pMUT array 100 having elements of a single size and lacking degenerate modes.

In another advantageous embodiment, element populations coupled to a same drive/sense rail (i.e., of a same channel) have transducer elements arranged with nearest neighbors of a given transducer element being of a closely matching, but different, membrane size, for a graduated spatial variation in membrane size. Relative to the array 700 (FIG. 7A), it has been found that resonance phase can be best maintained across the element population with nearest neighboring elements having similar sized membranes such that the change in membrane diameters over a given distance (e.g., two, three, or more membrane diameters) does not exceed a particular threshold as the phase relationship between adjacent membranes may otherwise act to significantly reduce a channel's signal output/sensitivity. For example, the action of an aggressor/offender membrane may locally push, or pile up, the transmission media over the victim membrane (e.g., a nearest neighbor or otherwise proximal to the offender), increasing effective membrane mass of the second membrane at inopportune times with respect to the victim membrane's phase and thereby dampen or retard performance of the victim element. If such acoustic dampening (or transmission media dampening) is severe, an undesirable zero crossing can occur.

Figure 7D:
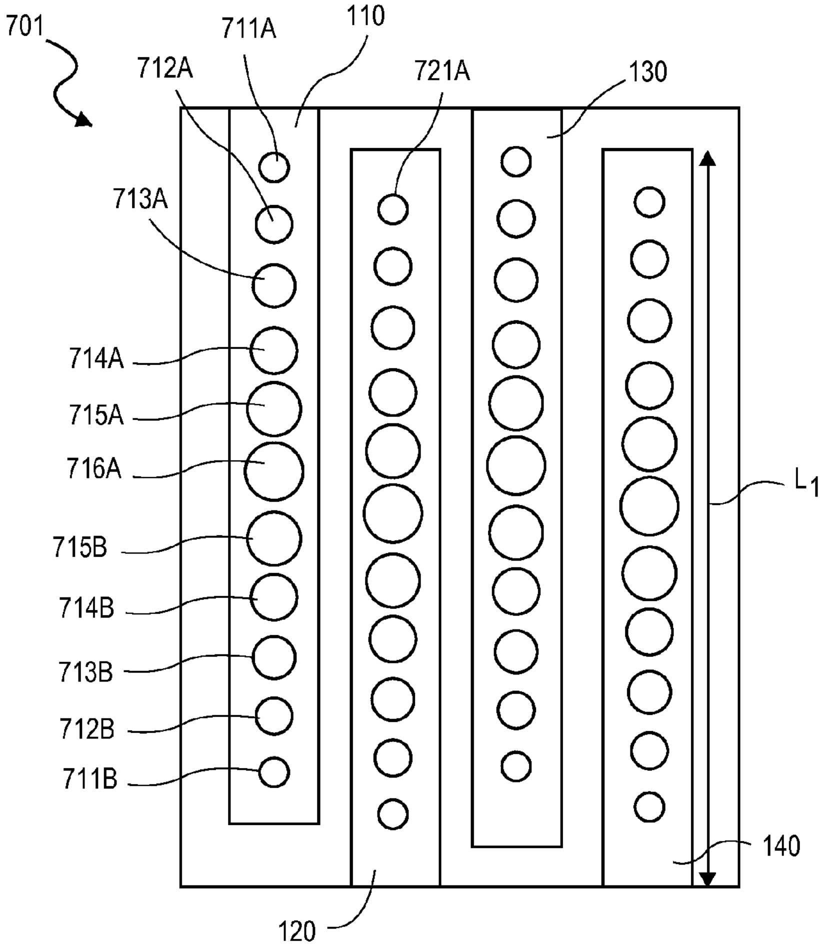
FIG. 7D is a plan view of a pMUT array with transducer elements of differing sizes, in accordance with an embodiment.

FIG. 7D is a plan view of a pMUT array 701 with transducer elements of graduated sizes, in accordance with one such embodiment. For the exemplary embodiment depicted in FIG. 7D, the piezoelectric transducer element 711A a first size (e.g., smallest diameter membrane) is adjacent to element 712A of a second size (e.g., next larger diameter membrane) with the membrane size gradually increasing in a step-wise manner through elements of greater membrane size (e.g., 714A, 715A, 716A). Each of the elements 711A-715A has nearest neighbors that are only slightly smaller and slightly larger for a monotonic, step-wise, graduated, and/or incremental, increase in membrane size across the population of different sized elements. The array 701 in FIG. 7D then replicates the population of transducer elements such that the element 716A with the largest diameter membrane adjacent to two elements of a next smaller membrane diameter (e.g., 715B). The membrane size is then decreased, again in a step-wise, incremental manner (e.g., 714B, 713B, 712B, 711B) such that all elements again have nearest neighbors that are closest in their size (diameter).

Separate element populations may be arranged relative to each other such that membranes of most similar size are in closest proximity or such that membranes of most different size are in closest proximity, depending on the embodiment. As shown in FIG. 7D, elements of same size (e.g., 711A and 721A) but of different populations (e.g., associated with separate electrode rails 110 and 120) are proximate to each other. Of course, each channel may have element populations shifted similar to the embodiment shown in FIG. 7A so as to have membranes of a differing size adjacent to each other with the greater spacing between channels accommodating the electrode rails 110 and 120 increasing the nearest neighbor distance to mitigate potential dampening effects resulting from larger membrane size variation.

Figure 7E:
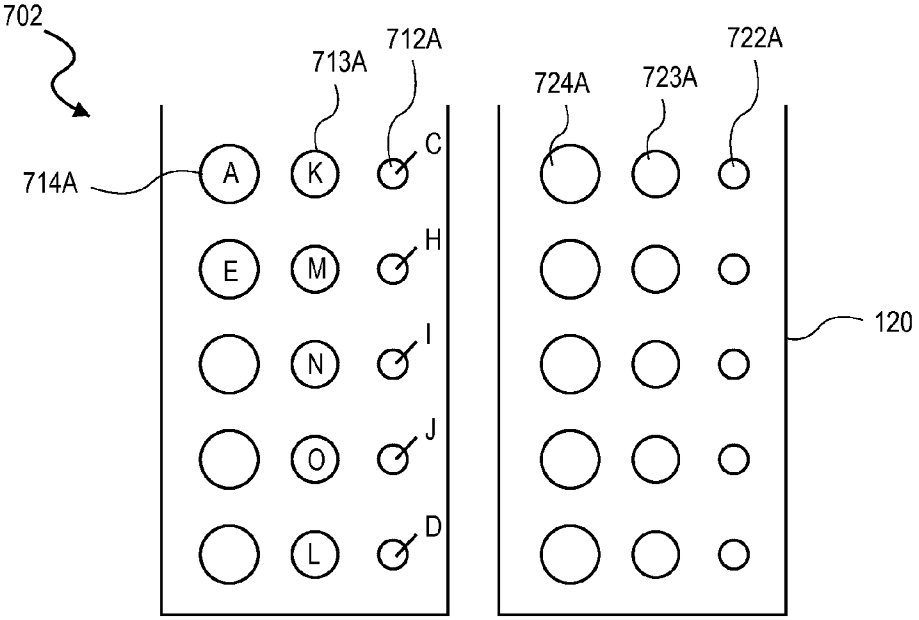
FIG. 7E is a plan view of a pMUT array with transducer elements of differing sizes, in accordance with an embodiment.

In addition to the phase variation across transducer elements within a population (e.g., within a channel), resonant frequency of a given element is also dependent on the number of proximal neighbors of differing membrane size with a greater transmission media dampening (i.e., acoustic crosstalk) when the number of proximal neighbors of differing size is larger. In embodiments, asymmetrical element layouts are employed to reduce the number of proximal neighbors of differing size within an element population. FIG. 7E is a plan view of a pMUT array 702 with transducer elements of differing sizes, in accordance with an embodiment. As shown, each channel (e.g., electrode rail 110) includes a column of elements with membranes of a first size (e.g., 713A) adjacent to a column of elements with membranes of a second size (e.g., 714A being the largest membrane size) and a column of elements with membranes of a third size 712A (e.g., 712A being the smallest membrane size). As was described in the context of FIG. 7D, the array 702 maintains a graduated spatial distribution of membrane sizes, for example incrementally increasing from 85 μm, 90 μm, and 95 μm. For the illustrated population including 15 elements coupled to the electrode rail 110 (and likewise for those coupled to electrode rail 120), four corner elements A, B, C, and D have a coordination number of 2, eight edge elements E, F, G, H, I, J, K, and L have a coordination number of 3, and three interior elements M, N, and O have a coordination number of 4. For these subsets, the corner and edge elements (A, B, C, D, E, F, G, H, I, J, K) have only one nearest neighbor of a different size (<50% of the coordination number) while the three interior elements M, N, O have two nearest neighbors of different size (50% the coordination number). The graduated membrane size therefore occurs along only one dimension (column or row). For a second channel then (e.g., 120), this pattern is repeated for transducers (e.g., 724A, 723A, 722A). As such, the additional asymmetry provided by edge and corner elements may display reduced transmission media dampening relative to the single column embodiment depicted in FIG. 7D.

While the pMUT arrays 700, 701, and 702 are exemplary 1D arrays where the transducer element population is disposed over a length of the substrate that is at larger than a width of the substrate occupied by the element population (e.g., >=5x), 2D arrays may also employ a plurality of transducer elements within a given element population and the heuristics thus far described in the context of 1D arrays may be again utilized. FIG. 8 is a plan view of a 2D pMUT array 800 having transducer elements A, B, C, D of differing sizes, in accordance with an embodiment. As shown, tiled over a substrate 101 are a plurality element populations, each electrically coupled to a same drive/sense electrode (e.g., 810A, 820A, 830A, 840A and 850A) comprise a row $R_1$ of element populations. Similarly, a plurality of element populations, each electrically coupled to a same drive/sense electrode (e.g., 810A, 810B, 810C, 810D and 810E) comprise a column $C_1$ of element populations. The rows R1-R5 and C1-C5 therefore provide a 5×5 array of element populations. Within each element population is a plurality of transducer element sizes (e.g., A, B, C and D) to provide the plurality of resonances for wider bandwidth spectral response substantially as was described in the context of 1D pMUT array 700.

Figure 8A:
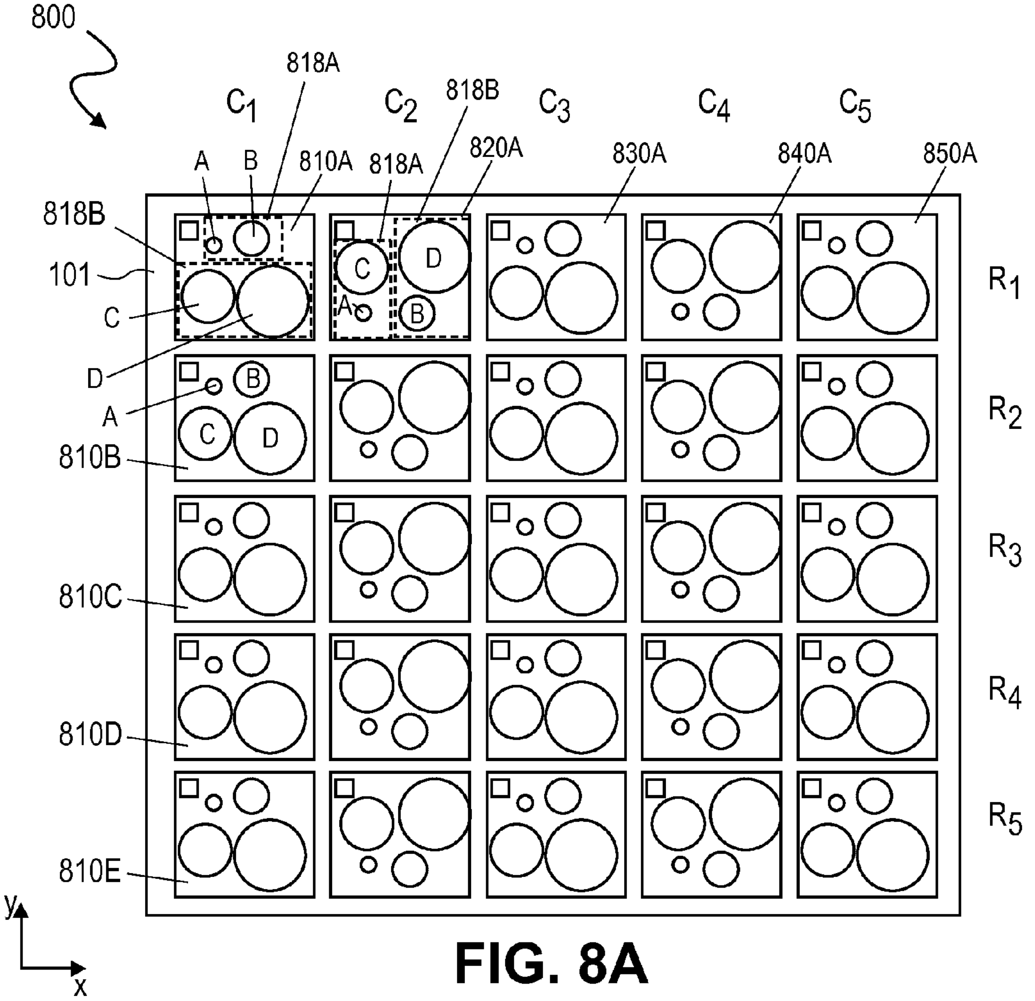
FIGS. 8A and 8B are plan views of pMUT arrays with transducer elements of differing sizes, in accordance with an embodiment.

In embodiments, a heuristic layout may be further applied in the 2D context to ensure each nearest neighboring transducer element has a different size and correspondingly different natural frequency for reduced crosstalk between adjacent element populations. As shown in FIG. 8A, each of the plurality of transducer element populations has a same relative spatial layout (i.e., arrangement of transducer element with respect to each other) within the population. Specifically, smallest transducer elements A,B form a first subgroup 818A disposed in sub-row over largest transducer elements C,D forming a second subgroup 818B. With the subgroups forming sub-rows internal to each element population, the populations within a column (e.g., $C_2$) are flipped vertically relative to the populations within adjacent columns (e.g., $C_1$ and $C_3$). For alternate embodiments where subgroup layout within each element population forms sub-columns of like-sized transducer elements, the populations within a row (e.g., $R_2$) are flipped (e.g., 180°) vertically relative to the populations within adjacent rows (e.g., $R_1$ and $R_3$).

Figure 8B:
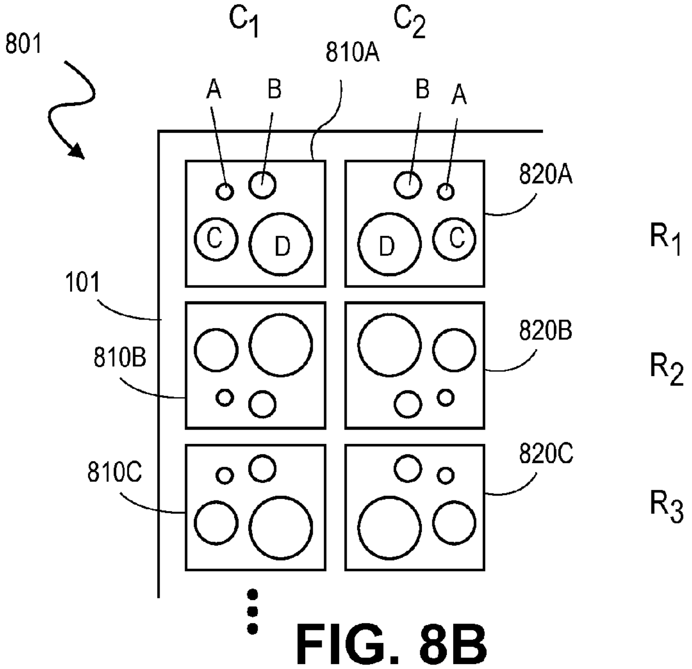

In an alternate embodiment shown in FIG. 8B, a 2D pMUT array 801 includes subgroups forming sub-rows internal to each element population. The populations within a column (e.g., $C_2$) are flipped horizontally relative to the populations within adjacent columns (e.g., $C_1$ and $C_3$) so that effects of transmission media dampening may be reduced by graduating the membrane size incrementally over a space of one channel (e.g., electrode rail 810A) and arranging nearest neighboring channels (e.g., 810B, 820A) to place membranes of nearest size (e.g., elements D) in closest proximity. The array 801 then repeats pair-wise, replicating the columns $C_1$ and $C_2$.

In an embodiment, a pMUT array includes a plurality of piezoelectric transducer element populations and at least one piezoelectric transducer element in each of the element populations has a piezoelectric membrane with an elliptical geometry. Piezoelectric membranes having different semi-principal axis dimensions provides an extra degree of freedom for shaping the frequency response of the transducer elements. In a further embodiment, at least first and second semi-principal axes are of sufficiently differing nominal length to provide the plurality of separate resonant frequencies. By reducing the rotational symmetry from all rotation angles for a circular or spheroidal membrane down to only 2-fold symmetry (180°), mode shapes can be made to split into more distinct modes having separated resonant frequencies. Such mode splitting is exploited in embodiments of a pMUT array to increase the bandwidth of each transducer, and therefore of the array.

Figure 9A:
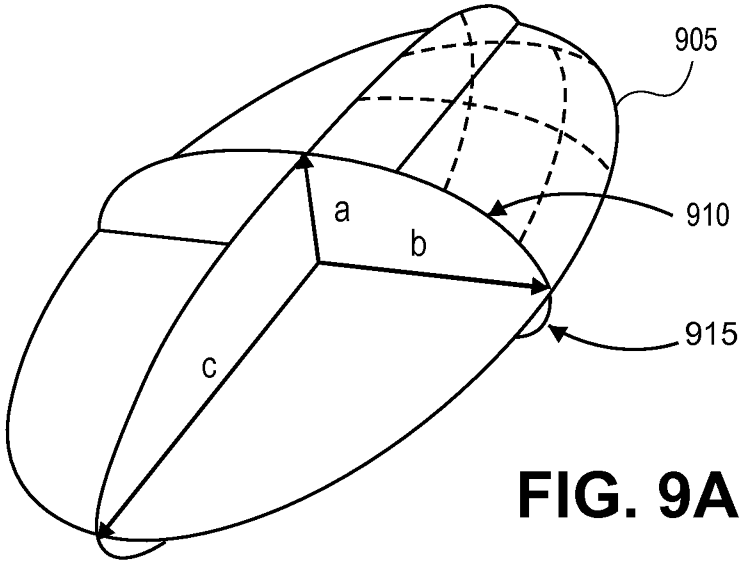
FIG. 9A is an isometric schematic of a transducer element with an elliptical geometry, in accordance with an embodiment.

FIG. 9A is an isometric schematic of a transducer element with an elliptical geometry, in accordance with an embodiment. The elliptical analogs of the planar, domed, and dimpled circular piezoelectric membranes described in the context of FIGS. 2A-2C are depicted in FIG. 9A as membrane surfaces 905, 910 and 915, respectively. Membrane surfaces 905, 910 and 915 are defined by the semi-principal axes a, b and c, with the axes b and c in a plane parallel to the substrate 101.

Figure 9B:
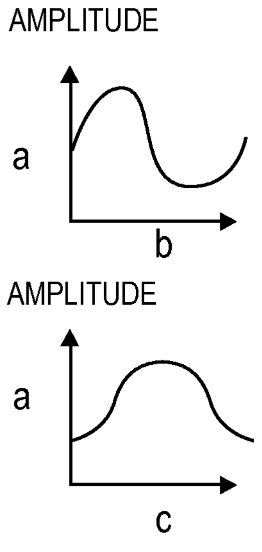
FIG. 9B is a graph depicting different mode functions for the semi-principal axes of a transducer element having an elliptical geometry, in accordance with an embodiment.
Figure 9C:
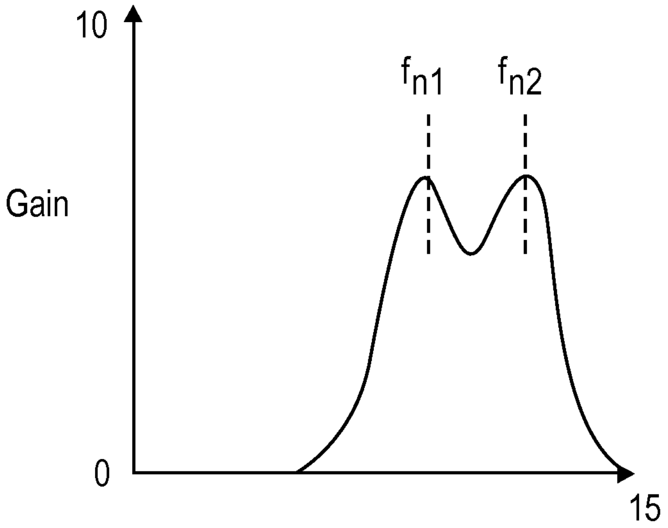
FIG. 9C is a graph of bandwidth for a transducer element having an elliptical geometry, in accordance with an embodiment.

FIG. 9B graphs different mode functions along the semi-principal axes b and c of a transducer element having an elliptical geometry, in accordance with an embodiment. As shown, an amplitude of displacement along the a axis as a function of position on the b axis has a different frequency and/or phase than displacement as a function of position on the c axis. FIG. 9C is a graph of bandwidth for a transducer element having an elliptical geometry, in accordance with an embodiment. As shown, the frequency response includes a first resonance at a center frequency of $F_{n1}$ and a second resonance having a center frequency of $F_{n2}$. This mode splitting serves to increase frequency response bandwidth beyond that of either of the modes alone.

As described in FIGS. 2A-2C, lithographic patterning may be utilized to form circular piezoelectric membranes. Similarly, lithographic patterning may be utilized to form elliptical or ellipsoidal piezoelectric membranes. A photolithographic plate or reticle may either include elliptical forms which are then imaged onto the substrate, or astigmatic focus techniques may be used to image elliptical patterns from a reticle having circular shapes. Such elliptical images printed on a photoresist for example may be reflowed as a means of transferring an ellipsoidal shape to a piezoelectric membrane.

Figure 10B:
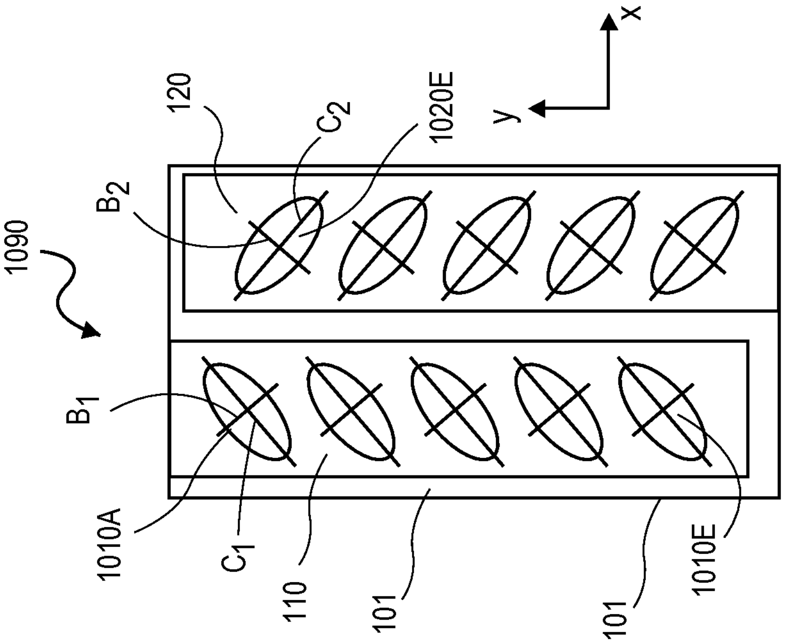
FIGS. 10A, 10B and 10C are plan views of pMUT arrays having transducer elements with an elliptical geometry, in accordance with embodiments.
Figure 10A:
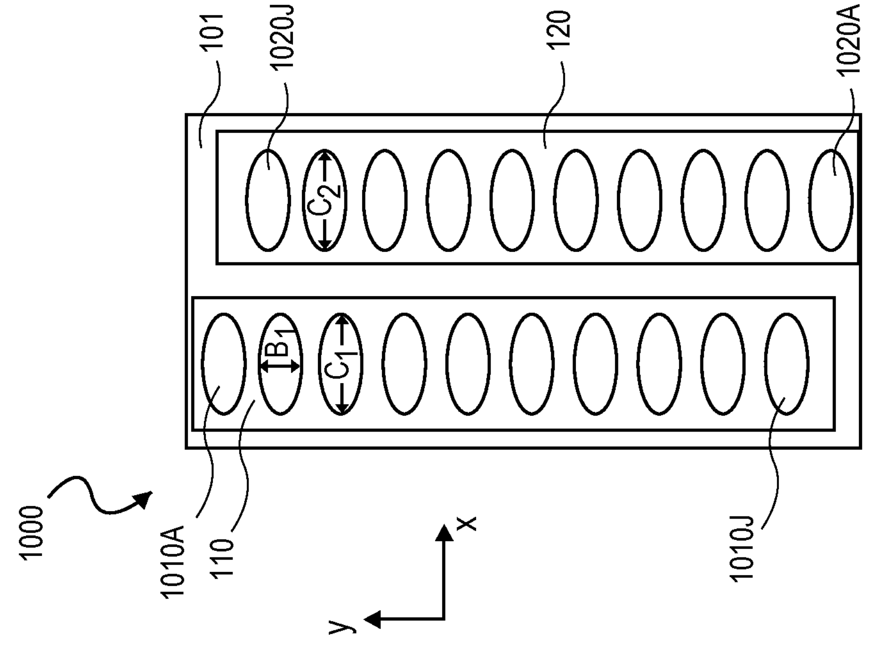
Figure 10C:
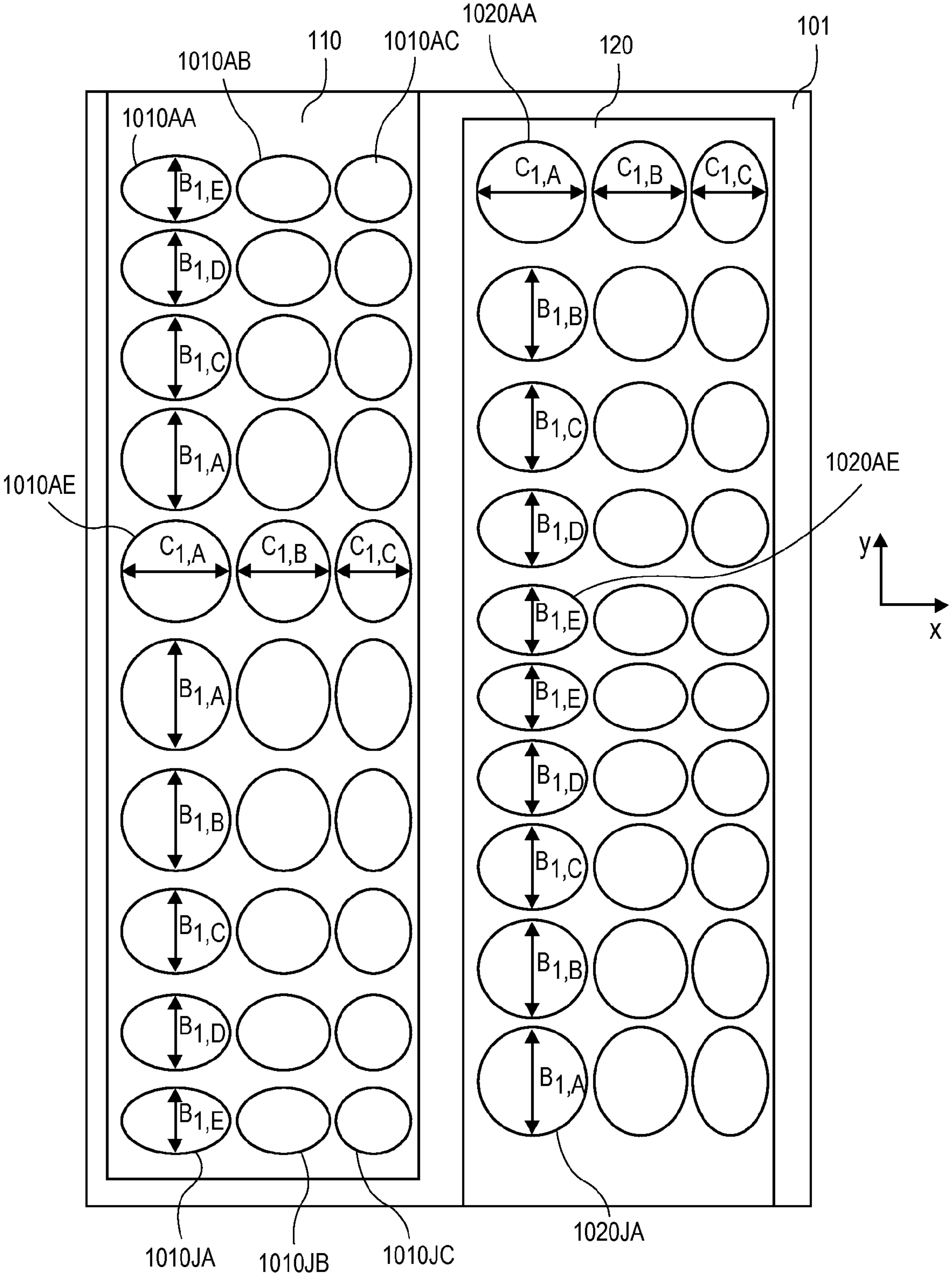

In an embodiment, a pMUT array includes a plurality of piezoelectric transducer element populations and every piezoelectric transducer element in each of the element populations has a piezoelectric membrane with an elliptical geometry. FIGS. 10A, 10B, and 10C are plan views of pMUT arrays having transducer elements with an elliptical geometry, in accordance with embodiments. As shown in FIG. 10A, a pMUT array 1000 is disposed across an area of the substrate 101. Following the exemplary 1D array structure previously described, separate (powered) electrode rails 110 and 120 each couple respective populations of transducer elements 1010A-1010J, and 1020A-1020J to a same drive/sense potential for lumped element operation. In the exemplary embodiment illustrated, first and second semi-principal axes for every piezoelectric membrane within one of the piezoelectric transducer element populations are all parallel.

Parallel alignment of axes provides advantageously high fill factor to preserve sensitivity amid pushing the resonant frequency higher by increasing one semi-principal axis while decreasing the other one to keep the surface area constant. As shown for the 1D array which has distinct lines of element populations, the shorter of the first and second semi-principal axes is aligned in a direction parallel to the longest length of the line or length of substrate occupied by one the element population (i.e., shorter semi-principal axis is aligned with the y-axis). The longer axis (e.g., $c_1$ or $c_2$) is then parallel to the x-axis to fill as much substrate area as possible for a given electrode rail line pitch.

In an embodiment, corresponding axes of elliptical piezoelectric membranes are oriented differently between adjacent transducer element populations. By changing the orientation of the elliptical membranes with respect to each other, electromechanical crosstalk between elements can be reduced. In one such embodiment, two semi-principal axes in the plane of the substrate for membranes in a first piezoelectric transducer element population are all substantially orthogonal to membrane axes in a second piezoelectric transducer element population adjacent to the first element population. For example, FIG. 10B illustrates a pMUT array 1090 where a first element population coupled to the drive/sense rail 110 has membranes 1010A-1010E with semi-principal axes at a first orientation, non-parallel to the length, or y-dimension, of the substrate, while semi-principal axes of a second element population (e.g., 1020E, etc.) coupled to the drive/sense rail 120 have a second orientation, orthogonal to the first orientation. In this configuration, a resonant mode along the $c_1$ axis of element 1010A is off-axis with the resonant mode along the $c_2$ axis of neighboring element 1020E. For the exemplary 1D embodiment where element populations extend over a longer length of the substrate than over a width of the substrate, the first and second semi-principal axes are oriented at 45° off the length of the element populations so that a consistent fill factor and consistent number of element is provided for a fixed pitch of element populations (e.g., drive/sense rail pitch). A 45° offset adjacent populations may be similarly utilized in 2D array implementations.

In an embodiment, an array of elliptical piezoelectric membranes has at least one of the semi-principal axes varied along a first dimension of the array. In further embodiments, the variation in a semi-principal axis is graduated so that the axis length increments in a monotonic, step-wise, graduated, and/or incremental, manner (increase and/or decrease) across the population of different sized elements. As described elsewhere herein in the context of FIGS. 7D and 7E, acoustic coupling/cross-talk effects on element performance may be improved through changing the membrane dimensions in incrementally. In certain embodiments, an array of elliptical piezoelectric membranes has only one of the semi-principal axes varied along a first dimension of the array.

In further embodiments, a 2D array of elliptical piezoelectric membranes has semi-principal axes varied along both dimensions of the array. In one such embodiment, as illustrated in FIG. 10C, a 2D array of elliptical piezoelectric membranes has semi-principal axes B,C varied along both dimensions of the array with a first axis varied along a first dimension of the array and a second axis varied along a second dimension of the array. As further illustrated in FIG. 10C, each axis is incrementally increased (and/or decreased) across one of the array dimensions. As shown, the B axis increments from $B_{1,E}$ up to $B_{1,A}$, and then back down to $B_{1,E}$ for elements 1010AA, 1010AE, 1010JA, respectively, along one dimension of the array (e.g., the y-axis of the substrate 101). The column or row comprising 1010AB-101JB and the column or row comprising 1010AC-1010JC have the same B axis increment as for the 1010AA-101JA columns or row. The C axis, in turn increments with each element along a second dimension of the array (e.g., along x-axis of the substrate 101) such that all elements of the row comprising 1010AA-1010JA are dimensioned to have an axis equal to $C_{1,A}$, all elements of the row comprising 1010AB-1010JB are dimensioned to have an axis equal to $C_{1,B}$, and all elements of the row comprising 1010AC-1010JC are dimensioned to have an axis equal to $C_{1,C}$. As further illustrate in FIG. 10C, separate populations associated with separate channels (e.g., electrode rails 110, 120) have similar incremental changes in membrane dimension. For example, for electrode rail 120, there is one semi-principle axis B varied within the row or column from a maximum axis B length for 1020AA, down to a minimum axis B length for 1020AE, and back up to the maximum axis B length 1020JA. There is a shift in the location of membranes of a particular size relative to the adjacent channel (e.g., electrode rail 110) for the sake of an even spatial distribution of membranes of like size across the substrate 101.

In embodiments, a pMUT array having a plurality of independently addressable drive/sense electrode rails disposed over an area of a substrate has an element population coupled to one of each of the drive/sense electrode rails with closely packed transducer elements. In the exemplary embodiments, packing of adjacent element populations is less close than those within a population. Sensitivity of a pMUT array is proportion to the area of active piezoelectric area per line for the exemplary 1D array. As many of the techniques described herein that improve bandwidth, some loss of sensitivity may result and therefore greater piezoelectric membrane packing can improve, if not completely recover sensitivity lost for the sake of greater bandwidth relative to an exemplary single file line of transducer elements (e.g., as in FIG. 1). Notably, while an entire pMUT array might have uniformly close packed transducer elements, such an arrangement is subject to higher levels of crosstalk between element populations. Providing close packed transducer formations within each element population but non-close packed transducer formations between element populations may provide both good sensitivity and low levels of cross-talk between element populations.

Figure 11A:
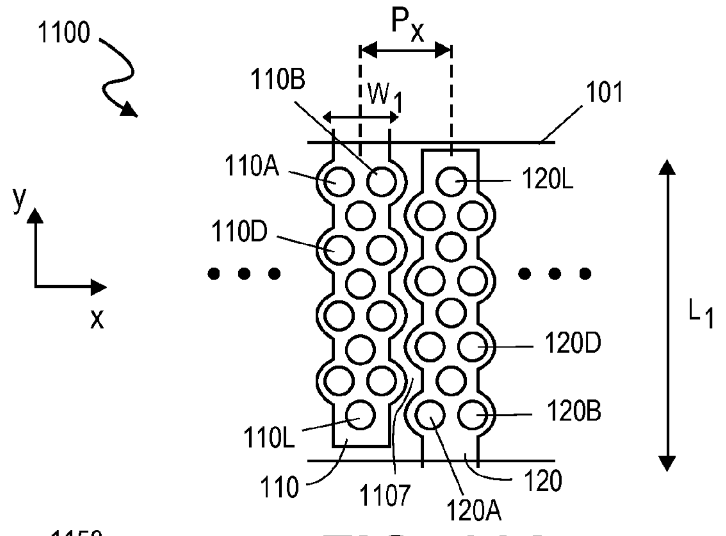
FIGS. 11A, 11B, and 11C are a plan views of pMUT arrays having closely packed transducer elements.
Figure 11B:
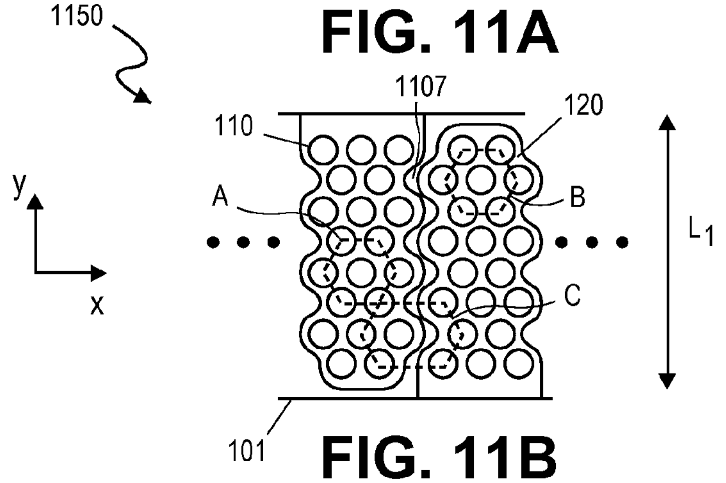
Figure 11C:
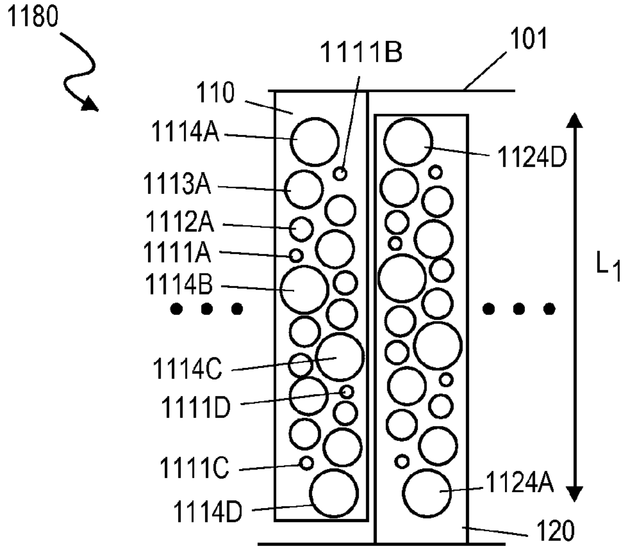

FIGS. 11A, 11B, and 11C are a plan views of pMUT arrays having close packed transducer elements. In FIG. 11A, the exemplary 1D array 1100 has the various attributes previously described herein in the context of FIG. 1, etc. The drive/sense electrode rails 110 and 120 form a one-dimensional array of drive/sense electrode rails along the first dimension (e.g., x-dimension) of the substrate 101. Coupled to the rail 110 are transducer elements 110A, 110B,110D, 110L, etc. that are disposed over the length $L_1$ of the substrate 101 along a second dimension (e.g., y-dimension). Generally, the length $L_1$ is at least five times larger than a width of the substrate occupied by the element population, but may be orders of magnitude larger for 1D implementations. In other words, each element population forms a column in the 1D array. Rather than a single file transducer arrangement however, at least two adjacent piezoelectric membranes overlap along the length of the substrate $L_1$ and with an offset from single file along width of the substrate $W_1$. While the pMUT array 1100 corresponds to a minimum number of adjacent piezoelectric membranes, three or more may be made adjacent along a dimension, as in the pMUT array 1150 depicted in FIG. 11B. Generally, the exemplary close packing is hexagonal within each population. In the exemplary embodiment, close packing (e.g., hexagons A and B) is not maintained between populations with a separation 1107 provided between adjacent element populations with loss of rotational packing symmetry (e.g., hexagon C) for at least crosstalk reduction purposes.

Generally, the close packing technique may be applied to any of the various transducer element configurations described herein, including 2D arrays, arrays with degenerate mode coupling, etc. In one advantageous embodiment where each piezoelectric transducer element population comprises a plurality of piezoelectric membranes of differing nominal membrane size (e.g., to provide a plurality of separate resonant frequencies), sensitivity can be significantly improved relative to the single file embodiment illustrated in FIG. 7A. FIG. 11C illustrates a pMUT array 1180 having multi-diameter close packed transducer populations. As shown, transducer elements of a same size (e.g., 1111A and 1111B) are separated for crosstalk reduction as previously described elsewhere herein while the size variation across membranes within a subgroup is utilized to increase packing density. In further embodiments, incremental changes in size between nearest neighbors may also be implemented in a manner that improves packing density. For example, elements 1111A, 1112A, 1113A, 1114A incrementally increase in size, as do elements 1111B-1114B, however the two subgroups are arranged symmetrically relative to each other to pack closely within the area of the rail 110. The closely packed subgroup pairing is then repeated within the rail 110 (e.g., with elements 1111C-1114C and 1111D-1114D). The closely packed arrangement within the rail 110 is then repeated for every channel (e.g., rail 120 with elements 1124A-1124D, etc.).

Figure 12:
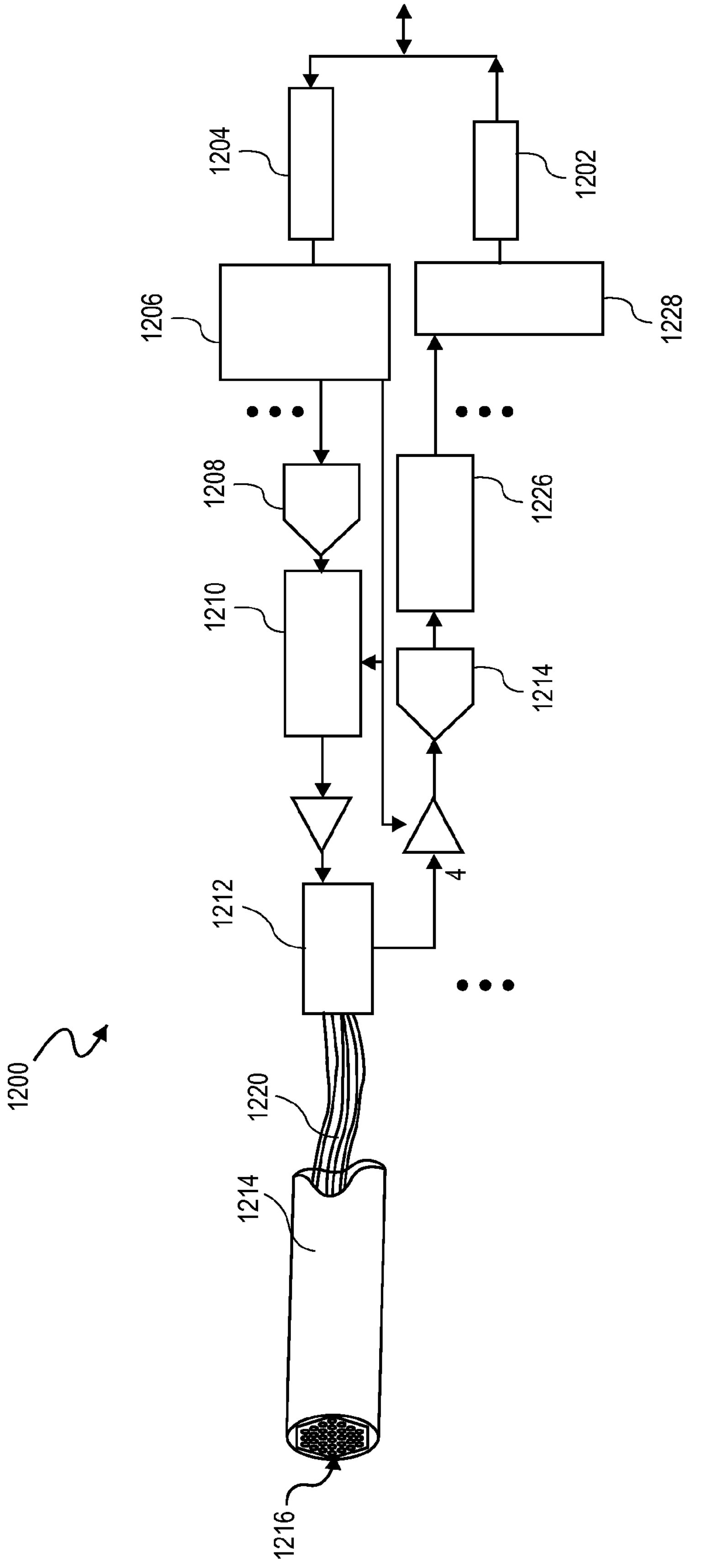
FIG. 12 is a functional block diagram of an ultrasonic transducer apparatus which employs a pMUT array, in accordance with an embodiment of the present invention.

FIG. 12 is a functional block diagram of an ultrasonic transducer apparatus 1200 that employs a pMUT array, in accordance with an embodiment of the present invention. In an exemplary embodiment, the ultrasonic transducer apparatus 1200 is for generating and sensing pressure waves in a medium, such as water, tissue matter, etc. The ultrasonic transducer apparatus 1200 has many applications in which imaging of internal structural variations within a medium or multiple media is of interest, such as in medical diagnostics, product defect detection, etc. The apparatus 1200 includes at least one pMUT array 1216, which may be any of the pMUT arrays described elsewhere herein having any of the transducer element and element population attributes described. In exemplary embodiment, the pMUT array 1216 is housed in a handle portion 1214 which may be manipulated by machine or by a user of the apparatus 1200 to change the facing direction and location of the outer surface of the pMUT array 1216 as desired (e.g., facing the area(s) to be imaged). Electrical connector 1220 electrically couple channels of the pMUT array 1216 to a communication interface external to the handle portion 1214.

In embodiments, the apparatus 1200 includes a signal generating means, which may be any known in the art, coupled to the pMUT array 1216, for example by way of electrical connector 1220. The signal generating means is to provide an electrical drive signal on various drive/sense electrodes. In one specific embodiment, the signal generating means is to apply an electrical drive signal to cause the piezoelectric transducer element populations to resonate at frequencies between 1 MHz and 40 MHz. In an embodiment, the signal generating means includes a de-serializer 1204 to de-serialize control signals that are then de-multiplexed by demux 1206. The exemplary signal generating means further includes a digital-to-analog converter (DAC) 1208 to convert the digital control signals into driving voltage signals for the individual transducer element channels in the pMUT array 1216. Respective time delays can be added to the individual drive voltage signal by a programmable time-delay controller 1210 to beam steer, create the desired beam shape, focus, and direction, etc. Coupled between the pMUT channel connector 1220 and the signal generating means is a switch network 1212 to switch the pMUT array 1216 between drive and sense modes.

In embodiments, the apparatus 1200 includes a signal collecting means, which may be any known in the art, coupled to the pMUT array 1216, for example by way of electrical connector 1220. The signal collecting means is to collect an electrical sense signal from the drive/sense electrode channels in the pMUT array 1216. In one exemplary embodiment of a signal collecting means, a analog to digital converter (ADC) 1214 is to receive voltages signals and convert them to digital signals. The digital signals may then be stored to a memory (not depicted) or first passed to a signal processing means. An exemplary signal processing means includes a data compression unit 1226 to compress the digital signals. A multiplexer 1228 and a serializer 1202 may further process the received signals before relaying them to a memory, other storage, or a downstream processor, such as an image processor that is to generate a graphical display based on the received signals.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A piezoelectric micromachined ultrasonic transducer (pMUT) array, comprising:

a plurality of drive/sense electrode rails disposed over an area of a substrate and electrically addressable independently; and a plurality of piezoelectric transducer element populations, wherein drive/sense electrodes within an element population are coupled to one of the drive/sense electrode rails, wherein electromechanical coupling between transducer elements of different transducer element populations is less than electromechanical coupling between transducer elements of a same element population, and wherein each transducer element population is to provide a plurality of separate but overlapping frequency responses; wherein the electromechanical coupling between transducer elements of a same element population is sufficient to induce at least one degenerate mode, the at least one degenerate mode having a degenerate resonant frequency split from a natural resonant frequency of an individual piezoelectric transducer element in the element population, wherein at least one of a distance, the elastic modulus of a material, or a cross-sectional coupling area of a first region between transducer elements of a same element population is different than a corresponding one of a second region between transducer elements of a different element populations, wherein two or more of the distance, the elastic modulus, or the cross-sectional coupling area are different between the first and second regions.

2. The pMUT array of claim 1, wherein the plurality of frequency responses comprises more than two distinct frequency peaks.

3. The pMUT array of claim 1, wherein the electromechanical coupling between transducer elements of a same element population is sufficient to induce a plurality of degenerate modes, the plurality of degenerate modes having degenerate resonant frequencies split from each other.

4. The pMUT array of claim 1, wherein an interconnecting material and cross-sectional coupling areas are the same in the first and second regions.

5. The pMUT array of claim 1, wherein each piezoelectric transducer element population is disposed over a length of the substrate that is at least five times larger than a width of the substrate occupied by the element population with piezoelectric membranes arranged in single file with centers aligned along a straight line.

6. The pMUT array of claim 1, wherein each piezoelectric transducer element population is disposed over a length of the substrate that is at least five times larger than a width of the substrate occupied by the element population with the plurality of piezoelectric transducer elements arranged in a close packed configuration where at least two adjacent piezoelectric membranes overlap along the length of the substrate and are offset from single file along width of the substrate.

7. The pMUT array of claim 1, wherein each piezoelectric transducer element population comprises a plurality of piezoelectric membranes of differing membrane size to provide a plurality of separate resonant frequencies.

8. The pMUT array of claim 7, wherein each piezoelectric transducer element population comprises more than one piezoelectric transducer element of each membrane size.

9. The pMUT array of claim 8, wherein each piezoelectric transducer element population is disposed over a length of the substrate that is at least five times larger than a width of the substrate occupied by the element population; and wherein each piezoelectric transducer element population further comprises a plurality of transducer element subgroups, each subgroup comprising one piezoelectric transducer element of each nominal membrane size; and wherein the element population has transducer elements of a same size spaced apart by at least one intervening element of a different size and no more than a length of the substrate occupied by one element subgroup.

10. The pMUT array of claim 7, wherein piezoelectric membranes of each piezoelectric transducer element population are in single file along a first dimension.

11. The pMUT array of claim 7, wherein piezoelectric membranes of each piezoelectric transducer element population are in a close packed configuration having at least two adjacent piezoelectric membranes overlapping along the length of the substrate and offset from single file along width of the substrate.

12. The pMUT array of claim 7, wherein the plurality of drive/sense electrode rails forms a two-dimensional array of drive/sense electrode rails along a first and second dimension of the substrate;

wherein each of the plurality of transducer element populations comprises a same number of transducer elements, and each of the plurality of transducer element populations has a same relative spatial arrangement of transducer elements, and wherein a first transducer element population coupled to a first drive/sense electrode rail has the relative spatial arrangement of transducer elements at a first orientation, and wherein a second transducer element population coupled to second drive/sense electrode rail has the relative spatial arrangement of transducer elements at a second orientation.

13. The pMUT array of claim 1, wherein transducer elements within each transducer element population is closely packed and wherein adjacent transducer element populations are less closely packed than those within an element population.

14. The pMUT array of claim 1, wherein at least one piezoelectric transducer element in each of the element populations comprises a piezoelectric membrane having an elliptical geometry with at least first and second semi-principal axes of differing length to provide the plurality of separate resonant frequencies.

15. The pMUT array of claim 14, wherein the elliptical geometry comprises an ellipsoid having a first, second and third semi-principal axes, wherein the first and second semi-principal axes are in the plane of the substrate.

16. The pMUT array of claim 14, wherein the first and second semi-principal axes for membranes within one of the piezoelectric transducer element populations are in a plane that is parallel with the area of the substrate.

17. The pMUT array of claim 16, wherein the shorter of the first and second semi-principal axes is aligned in a direction parallel to a longest length of the substrate occupied by one of the element populations.

18. The pMUT array of claim 16, wherein first and second semi-principal axes of a first element population have a first orientation, and wherein a first and second semi-principal axes of a second element population adjacent to the first population have a second orientation, orthogonal to the first orientation.

19. The pMUT array of claim 18, wherein the first and second semi-principal axes are oriented at 45° relative to a longest length of the substrate occupied by one of the element populations.

20. An apparatus for generating and sensing pressure waves in a medium, the apparatus comprising:

the pMUT array of claim 1;

generating means coupled to the pMUT array to apply an electrical drive signal on at least one drive/sense electrode;

receiving means coupled to the pMUT array to receive an electrical response signal from at least one drive/sense electrode; and signal processing means coupled to the receiving means to process electrical response signals received from the plurality of the drive/sense electrodes.

21. The apparatus of claim 20, wherein the generating means is to apply an electrical drive signal to cause at least one of the piezoelectric transducer element populations to resonate at frequencies between 1 MHz and 15 MHz.

22. A piezoelectric micromachined ultrasonic transducer (pMUT) array, comprising:

a plurality of drive/sense electrode rails disposed over an area of a substrate and electrically addressable independently; and a plurality of piezoelectric transducer element populations, every drive/sense electrode within an element population being coupled to one of the drive/sense electrode rails, wherein at least one piezoelectric transducer element in each of the element populations comprises a piezoelectric membrane having an elliptical geometry with at least first and second semi-principal axes of differing nominal length.

23. The pMUT array of claim 22, wherein the elliptical geometry comprises an ellipsoid having a first, second and third semi-principal axes, wherein the first and second semi-principal axes are in the plane of the substrate.

24. The pMUT array of claim 22, wherein the first and second semi-principal axes for every membrane within one of the piezoelectric transducer element populations are all in a plane that is parallel with the area of the substrate.

25. The pMUT array of claim 24, wherein the plurality of drive/sense electrode rails form a one-dimensional array of drive/sense electrode rails along a first dimension of the substrate;

wherein each piezoelectric transducer element population is disposed over a length of the substrate along a second dimension of the substrate, orthogonal to the first dimension, the length being is at least five times larger than a width of the substrate; and wherein a shorter of the semi-principal axes in the plane of the substrate is aligned in parallel with the second dimension of the substrate.

26. The pMUT array of claim 25, wherein the plurality of drive/sense electrode rails form a one-dimensional array of drive/sense electrode rails along a first dimension of the substrate;

wherein each piezoelectric transducer element population is disposed over a length of the substrate along a second dimension of the substrate, orthogonal to the first dimension, the length being is at least five times larger than a width of the substrate; and wherein the semi-principal axes in the plane of the substrate are all non-parallel to the second dimension of the substrate.

27. The pMUT array of claim 26, wherein two semi-principal axes in the plane of the substrate for membranes in a first piezoelectric transducer element population are all substantially orthogonal to membrane axes in a second piezoelectric transducer element population adjacent to the first element population.

28. A piezoelectric micromachined ultrasonic transducer (pMUT) array, comprising:

a plurality of drive/sense electrode rails disposed over an area of a substrate and electrically addressable independently; and a plurality of piezoelectric transducer element populations, every drive/sense electrode within an element population being coupled to one of the drive/sense electrode rails, wherein each piezoelectric transducer element population comprises a plurality of piezoelectric membranes of graduated membrane size;

wherein the element population comprises more than one row and more than one column of membranes;

wherein the plurality of drive/sense electrode rails form a one-dimensional array of drive/sense electrode rails along a first dimension of the substrate, and wherein each piezoelectric transducer element population is disposed over a length of the substrate along a second dimension of the substrate, orthogonal to the first dimension, the length being is at least five times larger than a width of the substrate;

wherein each piezoelectric transducer element population further comprises a plurality of transducer element subgroups, each subgroup comprising one piezoelectric transducer element of each nominal membrane size; and wherein the element subgroup repeats along the entire length of the substrate occupied by the element population to have transducer elements of a same size spaced apart by at least one intervening membrane of differing size, but by no more than a length of the substrate occupied by one element subgroup.

29. The pMUT array of claim 28, wherein membranes of each piezoelectric transducer element population has no more than two nearest neighbors of a different membrane size.

30. The pMUT array of claim 28, wherein nearest neighboring membranes of adjacent transducer element populations coupled to different electrodes are of a different size.

31. The pMUT array of claim 28, wherein the plurality of drive/sense electrode rails form a two-dimensional array of drive/sense electrode rails along a first and second dimension of the substrate;

wherein each of the plurality of transducer element populations comprises a same number of transducer elements, and each of the plurality of transducer element populations has a same relative spatial arrangement of transducer elements, and wherein a first transducer element population coupled to a first drive/sense electrode rail has the relative spatial arrangement of transducer elements at a first orientation, and wherein a second transducer element population coupled to second drive/sense electrode rail has the relative spatial arrangement of transducer elements at a second orientation.

32. A piezoelectric micromachined ultrasonic transducer (pMUT) array, comprising:

a plurality of drive/sense electrode rails disposed over an area of a substrate and electrically addressable independently;

a plurality of piezoelectric transducer element populations each corresponding to a different respective one of the plurality of drive/sense electrode rails, wherein for each piezoelectric transducer element population of the plurality of piezoelectric transducer element populations, every drive/sense electrode within the piezoelectric transducer element population is coupled to the drive/sense electrode rail corresponding to the piezoelectric transducer element population, wherein an adjacency of transducer elements within any of the plurality of piezoelectric transducer element populations is less than an adjacency of any two of the plurality of piezoelectric transducer element populations.

33. The pMUT array of claim 32, wherein the plurality of drive/sense electrode rails form a one-dimensional array of drive/sense electrode rails along a first dimension of the substrate, and wherein each piezoelectric transducer element population is disposed over a length of the substrate along a second dimension of the substrate, orthogonal to the first dimension, the length being is at least five times larger than a width of the substrate;

wherein piezoelectric membranes of each piezoelectric transducer element population are in a close packed configuration having at least two adjacent piezoelectric membranes overlapping along the length of the substrate and offset from single file along width of the substrate.

34. The pMUT array of claim 32 wherein each piezoelectric transducer element population comprises a plurality of piezoelectric membranes of differing nominal membrane size to provide a plurality of separate resonant frequencies.

35. The pMUT array of claim 34, wherein each piezoelectric transducer element population comprises more than one piezoelectric transducer element of each nominal membrane size.

* * * * *